US006996788B2

(12) United States Patent
Akiba et al.

(10) Patent No.: US 6,996,788 B2
(45) Date of Patent: Feb. 7, 2006

(54) HARDWARE-OPERATION DESCRIPTION CONVERSION METHOD AND PROGRAM THEREFOR

(75) Inventors: Takashi Akiba, Kanagawa-Ken (JP); Masato Igarashi, Chiba-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 315 days.

(21) Appl. No.: 10/463,389

(22) Filed: Jun. 18, 2003

(65) Prior Publication Data

US 2004/0002845 A1 Jan. 1, 2004

(30) Foreign Application Priority Data

Jun. 19, 2002 (JP) ............................. 2002-178945

(51) Int. Cl.
*G06F 17/50* (2006.01)
*G06F 17/28* (2006.01)
*G06F 9/45* (2006.01)

(52) U.S. Cl. ..................... 716/3; 716/5; 716/7; 716/18; 704/2; 717/114; 717/137; 717/142; 717/143

(58) Field of Classification Search .................... 716/3, 716/5, 7, 18; 704/2; 717/114, 137, 142, 717/143

See application file for complete search history.

(56) References Cited

U.S. PATENT DOCUMENTS

| | | | | | |
|---|---|---|---|---|---|
| 5,471,398 | A | * | 11/1995 | Stephens ..................... | 716/21 |
| 5,870,308 | A | * | 2/1999 | Dangelo et al. .............. | 716/18 |
| 6,077,315 | A | * | 6/2000 | Greenbaum et al. ........ | 717/157 |
| 6,167,363 | A | * | 12/2000 | Stapleton ..................... | 703/14 |
| 6,182,268 | B1 | | 1/2001 | McElvain | |
| 6,195,786 | B1 | * | 2/2001 | Raghunathan et al. ......... | 716/2 |
| 6,233,540 | B1 | * | 5/2001 | Schaumont et al. .......... | 703/14 |
| 6,298,472 | B1 | * | 10/2001 | Phillips et al. ................ | 716/18 |
| 6,397,341 | B1 | * | 5/2002 | Genevriere ................. | 713/400 |
| 6,487,698 | B1 | * | 11/2002 | Andreev et al. ............... | 716/3 |
| 6,493,863 | B1 | * | 12/2002 | Hamada et al. ............... | 716/18 |
| 6,606,588 | B1 | * | 8/2003 | Schaumont et al. .......... | 703/15 |
| 6,643,630 | B1 | * | 11/2003 | Pegatoquet et al. .......... | 706/45 |
| 6,816,828 | B1 | * | 11/2004 | Ikegami ...................... | 703/15 |
| 2001/0034876 | A1 | * | 10/2001 | Panchul et al. ............... | 716/18 |
| 2002/0026633 | A1 | * | 2/2002 | Koizumi et al. ............ | 717/146 |

(Continued)

OTHER PUBLICATIONS

Semeria et al., "RTL C-based Methodology for Designing and Verifying a Multi-Threaded Processor", 39th Proceeding of Design Automation Conference, Jun. 10, 2002, pp. 123-128.*

(Continued)

*Primary Examiner*—Matthew Smith
*Assistant Examiner*—Phallaka Kik
(74) *Attorney, Agent, or Firm*—Finnegan, Henderson, Farabow, Garrett & Dunner, L.L.P.

(57) ABSTRACT

A verilog-HDL source at the register-transfer level (RTL) is converted into a programming language executable on computer. Constructed in an analyzing of elements is a data structure corresponding to the elements of the verilog-HDL source. Created in an analyzing of a data-flow are a first data flow from a state register and a second flow from data-path register. Reconstructed in a reconstructing of a control-structure is the first data flow. Reconstructed in a reconstructing of a data-path is the second data flow so that the reconstructed second data is constituted only by circuitry operating in each state of the control structure. Each reconstructed data flow is mapped in each state of the control structure in a combining of the control-structure/data-flow, to output an behavior-level intermediate language. The intermediate language is converted into a programming language in a generating of an object-code.

18 Claims, 35 Drawing Sheets

U.S. PATENT DOCUMENTS

| | | | |
|---|---|---|---|
| 2003/0005392 A1* | 1/2003 | Tojima | 716/2 |
| 2003/0126563 A1* | 7/2003 | Nakajima | 716/1 |
| 2003/0196194 A1* | 10/2003 | Johns et al. | 717/136 |
| 2003/0200511 A1* | 10/2003 | Nakajima | 716/1 |
| 2003/0208730 A1* | 11/2003 | Singhal et al. | 716/4 |
| 2004/0019883 A1* | 1/2004 | Banerjee et al. | 717/152 |

OTHER PUBLICATIONS

Fischer et al., "NETHDL: Abstraction of Schematics to High-Level HDL", Proceedings of the European Design Automation Conference, Mar. 12, 1990, pp. 90-96.*

Buchholz et al., "Behavorial Emulation of Synthesized RT-level Descriptions Using VLIW Architectures", 1998 Ninth International Workshop on Rapid System Prototyping, Jun. 3, 1998, pp. 70-75.*

Varga et al., "Circuit Synthesis based on VHDL Language Transformations", The 6th IEEE International Conference on Electronics, Circuits and Systems, vol. 1, Sep. 5, 1999, pp. 225-228.*

Greaves; "A Verilog to C Compiler"; 11th IEEE International Workshop on Rapid System Prototyping, RSP 2000, (Jun. 21-23, 2000).

* cited by examiner

```
 1 : `timescale 1us/1us
 2 :
 3 : module example (clk, v1_in, v2_in, v3_in, v4_in, mul_out);
 4 :
 5 :    input clk;
 6 :    input [7:0] v1_in, v2_in, v3_in, v4_in;
 7 :    output [7:0] mul_out;
 8 :
 9 :    wire [7:0] _mul__tmp;
10 :    wire [7:0] add_out;
11 :    wire _add__tmp;
12 :    wire [7:0] mu1_out, mu2_out, mu3_out;
13 :    wire [7:0] a_mux_out, b_mux_out;
14 :
15 :    reg m1c, m2c, m3c, v3c, v4c, v5c, v6c;
16 :    reg a_mux_c, b_mux_c;
17 :    reg m1c_out;
18 :    reg m2c_out;
19 :    reg m3c_out;
20 :    reg a_mux_c_out, b_mux_c_out;
21 :    reg [1:0] state, next_state;
22 :    reg [7:0] v1_out, v2_out, v3_out;
23 :    reg [7:0] v4_out, v5_out, v6_out;
24 :
25 :    STATE REGISTER
26 :    always @(posedge clk) begin
27 :       state <= next_state;
28 :    end
29 :
30 :    CONTROL-SIGNAL OUTPUT UNIT
31 :    always @(state) begin
32 :       case (state)
33 :          0:begin
```

FIG. 22

```
34 :        m1c <= 1'b0;
35 :        m2c <= 1'b0;
36 :        m3c <= 1'b0;
37 :        v3c <= 1'b1;
38 :        v4c <= 1'b1;
39 :        v6c <= 1'b0;
40 :        v5c <= 1'b0;
41 :        a_mux_c <= 1'b1;
42 :        b_mux_c <= 1'b1;
43 :      end
44 :      1:begin
45 :        m1c <= 1'b1;
46 :        m2c <= 1'b1;
47 :        m3c <= 1'b1;
48 :        v3c <= 1'b0;
49 :        v4c <= 1'b0;
50 :        v6c <= 1'b1;
51 :        v5c <= 1'b1;
52 :        a_mux_c <= 1'b0;
53 :        b_mux_c <= 1'b0;
54 :      end
55 :      2:begin
56 :        m1c <= 1'b0;
57 :        m2c <= 1'b0;
58 :        m3c <= 1'b0;
59 :        v3c <= 1'b0;
60 :        v4c <= 1'b0;
61 :        v6c <= 1'b1;
62 :        v5c <= 1'b1;
63 :        a_mux_c <= 1'b0;
64 :        b_mux_c <= 1'b0;
65 :      end
66 :    endcase
67 : end
68 :
```

FIG. 23

```
69 :    NEXT-STATE DETERMINER
70 :    always @(state) begin
71 :      case (state)
72 :        0:begin
73 :          next_state <= 1;
74 :        end
75 :        1:begin
76 :          next_state <=2;
77 :        end
78 :        2:begin
79 :          next_state <=0;
80 :        end
81 :      endcase
82 :    end
83 :
84 :    always @ (posedge clk) begin
85 :      m1c_out <= m1c;
86 :    end
87 :
88 :    always @ (posedge clk) begin
89 :      m2c_out <= m2c;
90 :    end
91 :
92 :    always @ (posedge clk) begin
93 :      m3c_out <= m3c;
94 :    end
95 :
96 :    always @ (posedge clk) begin
97 :      v1_out <= v1_in;
98 :    end
99 :
100 :   always @ (posedge clk) begin
101 :     v2_out <= v2_in;
```

FIG. 24

```
102 :    end
103 :
104 :    always @ (posedge clk) begin
105 :       a_mux_c_out <= a_mux_c;
106 :    end
107 :
108 :    always @ (posedge clk) begin
109 :       b_mux_c_out <= b_mux_c;
110 :    end
111 :
112 :    always @ (posedge clk) begin
113 :       if (v3c == 1'b1)
114 :          v3_out <= v3_in;
115 :    end
116 :
117 :    always @ (posedge clk) begin
118 :       if ((v4c == 1'b1))
119 :          v4_out <= v4_in;
120 :    end
121 :
122 :    always @ (posedge clk) begin
123 :       if ((v5c == 1'b1))
124 :          v5_out <= mul_out;
125 :    end
126 :
127 :    always @ (posedge clk) begin
128 :       if((v6c == 1'b1))
129 :          v6_out <= add_out;
130 :    end
131 :
132 :    assign a_mux_out =((a_mux_c_out == 1'b1) ? v4_out: v6_out);
133 :
134 :    assign b_mux_out =((b_mux_c_out == 1'b1) ? v3_out: v5_out);
135 :
```

FIG.25

```
136 :    assign mu1_out =((m1c_out == 1'b1) ? v1_out: b_mux_out);
137 :
138 :    assign mu2_out =((m2c_out == 1'b1) ? v2_out: a_mux_out);
139 :
140 :    assign mu3_out =((m3c_out == 1'b1) ? a_mux_out: v2_out);
141 :
142 :    assign {_mul__tmp, mul_out} =(mu1_out * mu2_out);
143 :
144 :    assign {_add__tmp, add_out} =(mu3_out + b_mux_out);
145 :
146 : endmodule
```

FIG. 26

CONTROL STRUCTURE    DATA PATH

CONTROL STRUCTURE        DATA PATH

SIGNAL AND CONSTANT CONVERSION RULE

| INTERMEDIATE LANGUAGE | 1 TO 8 BIT BINARY DIGIT | 9 TO 16 BIT BINARY DIGIT | 17 TO 32 BIT BINARY DIGIT | 33 TO 64 BIT BINARY DIGIT |
|---|---|---|---|---|
| LANGUAGE C | UNSIGNED CHAR | UNSIGNED SHORT | UNSIGNED LONG | UNSIGNED LONG LONG |

FIG. 35

OTHER CONVERSION RULE

| INTERMEDIATE LANGUAGE | <= | BEGIN, END | CASE STATEMENT | CONCATENATION | === | !== | x | z |
|---|---|---|---|---|---|---|---|---|
| LANGUAGE C | = | NULL OR {,} | SWITCH STATEMENT | BIT OPERATION | == | != | 0 | 1 |

FIG. 36

COMPARISON BETWEEN KNOWN TECHNIQUE AND PRESENT INVENTION

| | C/C++ SOURCE EFFECTIVE CODE LINE NUMBER | ASSEMBLER CODE STEP NUMBER |
|---|---|---|
| VERILOG2C++ | 150 | 152 |
| PRESENT INVENTION | 20 | 49 |

FIG. 37

HARDWARE-OPERATION DESCRIPTION CONVERSION METHOD AND PROGRAM THEREFOR

CROSS REFERENCE TO RELATED APPLICATIONS

This application is based upon and claims benefit of priority from the prior Japanese Patent Application No. 2002-178945 filed on Jun. 19, 2002 in Japan, the entire contents of which are incorporated by reference.

FIELD OF THE INVENTION

The present invention relates to a method of hardware-operation description conversion and a program therefor. More particularly, this invention relates to a method of gaining resultant outputs with no redundant computations in conversion from hardware-operation description called RTL (Register-Transfer-Level) to hardware operations (behavior) and also to computer languages.

BACKGROUND OF THE INVENTION

Hardware designs usually employ a description technique called RTL. The RTL description is based on "synchronization at clocks". Simulation of the RTL description by software takes much time because of huge number of actions including the behavior of hardware to be operated. The RTL-description simulation could be faster if "synchronization at clocks" were not required. This is because it is enough for software that hardware (LSI) exhibits input/output responses, irrespective of whether or not the hardware has synchronization at internal clocks.

Recently proposed but not so popular is high-level synthesis, a technique to convert hardware operations described with a programming-language-like description technique under no consideration of hardware clocks into RTL description with a specific tool.

In contrast, behavior description requires fewer amount of description than RTL, achieving high productivity and high-speed simulation like above, thus shorting design and verification turnaround time at the behavior level.

The behavior description does not allow exact timing verification due to unsynchronization at clocks, nevertheless, still allows functional verification by simulation at the hardware behavior level and offers highly-functional stubs when viewed from software.

As discussed, the RTL description is based on "synchronization at clocks", thus RTL simulation on computer takes much time. On the contrary, the behavior description describes hardware operations (behavior) with no description of synchronization at clocks. The latter description technique allows high-speed simulation under no consideration of exact synchronization.

Therefore, conversion from hardware-design description which is RTL only at present, into behavior is feasible for high-speed simulation.

There are several tools for converting the RTL description into a computer language for software description, such as, Language C. One of them is Verilog2C++ (trademark).

These known techniques convert hardware RTL description in parallel processing into a computer language in serial processing.

For example, Verilog2C++ divides the RTL description into "register" and "combinational circuit/latch". Verilog2C++ sequentially converts the RTL description into source codes, a programming language executable on computer, while computational results at "combinational circuit/latch" are being transferred to "register" to produce outputs.

In detail, for example, as shown in FIG. 19, hardware is divided into an externally-accessible controllers A and data paths B each under control by signals from the corresponding controller A.

The controllers A and the data paths B are constituted by a register and a combinational circuit (or latch).

In detail, a hardware circuitry is constituted by a controller A and a data path (not shown) at a clock C1. Another hardware circuitry is constituted by a controller A and a data path B at a clock C2. Still another hardware circuitry is constituted by a controller A and a data path B at a clock C3, and so on.

The combinational circuit is equipped with a control-signal output unit and a next-state determining unit for outputting a computational result of the combinational circuit to a state register in a controller A or the register in a data path B.

The hardware circuitries operate in parallel while signals are being input to or output from the controllers A and the data paths B at respective clock timings.

In operation, a specific value input to the register (state register) in the controller A at the timing of clock C1 triggers a specific processing at the combinational circuit in the controller A in accordance with a value output from the state register.

A control signal is output from the control-signal output unit in the controller A to the register in the data path B at the timing of clock C2, a register value in the unit B being sent to the combinational circuit in the unit B for a specific processing.

Also at the same timing of clock C2, a computational result at the combinational circuit in the controller A is sent from the next-state determining unit in the controller A to the state register as a new value.

At the succeeding timing of clock C3, a control signal from the controller A and a computational result at the combinational circuit in the data path B are supplied to the register in the data path B, and a computational result at the combinational circuit in the controller A is supplied from the control-signal output unit in the controller A to the state register as a new value.

The hardware shown in FIG. 19 repeats these operations.

Verilog2C++ sequential processing of the RTL description for the hardware shown in FIG. 19, however, causes data dependency from "register" to "combinational circuit/latch" when the output of a latter-stage "register" is input to a former-stage "combinational circuit/latch", thus redundant processing unnecessary in operation but undetectable in the RTL description only remaining in a resultant program-language source.

SUMMARY OF THE INVENTION

In view of these problems, a purpose of the present invention is to provide a method of hardware-operation description conversion and a program therefor, obtaining resultant outputs with no redundant computations in conversion of RTL to behavior (and computer language).

A first aspect of the present invention is a method of converting RTL description to a computer-executable program language by a computer, the RTL description describing hardware, the hardware including a controller and a data path, the controller having a state register and a first combinational circuitry, the data path having a data-path register controlled by a control signal from the controller and a second combinational circuitry, the computer functioning as an element analyzer, a data-flow analyzer, a control-structure reconstructer, a data-flow reconstructer, a control-structure/data-flow combiner and an object-code generator, the method comprising: analyzing elements of the RTL description, at the element analyzer; creating a first data flow from the state register and a second data flow from the register in the data path, at the data-flow analyzer; reconstructing a control structure in which the controller controls the data path based on the first data flow, at the control-structure reconstructer; reconstructing the second data flow to create a data flow from the data-path register operating in each state of the control structure, at the data-flow reconstructer; mapping each reconstructed data flow in each state of the control structure, thus outputting an behavior-level intermediate language, at the control-structure/data-flow combiner; and converting the behavior-level intermediate language into a programming language executable on computer, at the object-code generator.

A second aspect of the present invention is a computer program executable on computer for hardware-operation description conversion of RTL description describing hardware, the hardware including a controller and a data path, the controller having a state register and a first combinational circuitry, the data path having a data-path register controlled by a control signal from the controller and a second combinational circuitry, comprising: analyzing elements in the RTL description; creating a first data flow from the state register and a second data flow from the data-path register; reconstructing a control structure in which the controller controls the data path through reconstruction of the created first data flow; reconstructing the second data flow to create a data flow from data-path registers operating in corresponding states of the control structure; mapping each reconstructed data flow in each state of the control structure, thus outputting an behavior-level intermediate language; and converting the behavior-level intermediate language into a programming language executable on computer.

BRIEF DESCRIPTION OF DRAWINGS

FIG. 22 is a list of a source program describing hardware employed in the embodiment according to the present invention;

FIG. 23 is a list of a source program describing hardware employed in the embodiment according to the present invention;

FIG. 24 is a list of a source program describing hardware employed in the embodiment according to the present invention;

FIG. 25 is a list of a source program describing hardware employed in the embodiment according to the present invention;

FIG. 26 is a list of a source program describing hardware employed in the embodiment according to the present invention;

FIG. 35 is an exemplary illustration of the conversion rule from an intermediate language to Language C in the embodiment according to the present invention;

FIG. 36 is another exemplary illustration of the conversion rule from an intermediate language to Language C in the embodiment according to the present invention; and FIG. 37 is an illustration indicating advantages of the embodiment according to the present invention.

DETAILED DESCRIPTION OF EMBODIMENTS

An embodiment according to the present invention will be disclosed with reference to the attached drawings.

The elements in the present invention are proceedings or functions in a hardware-description language. Each element in the embodiment is, thus, defined as a proceeding in RTL-Verilog-HDL (trademark), or Verilog-HDL at the register transfer level.

The present invention is executed by entering a target RTL description into a specific computer in which each unit analyzes, computes and processes the entered RTL description.

The specific computer in this invention functions as a RTL-description-element analyzer, a data-flow analyzer, a control structure reconstructor, a data-flow reconstructor, a control-structure/data-flow combiner, an object-code generator, and a redundant-statement deleter.

The outline of the embodiment will be explained with comparison to the known technique, before disclosing the method of hardware-operation description conversion.

The method of hardware-operation description conversion in this embodiment focuses on the following two characteristics (1) and (2) of hardware for combining operations in two clocks into those in one clock, thus achieving operations in one loop, which require two loops in the known technique.

(1) Once "state", the value, from a state register is determined, a control signal at the time of determination could be uniquely determined. And, (2) A control signal output from a controller operating at a clock will control a data path in hardware that will operate at the next clock.

Figure 19:
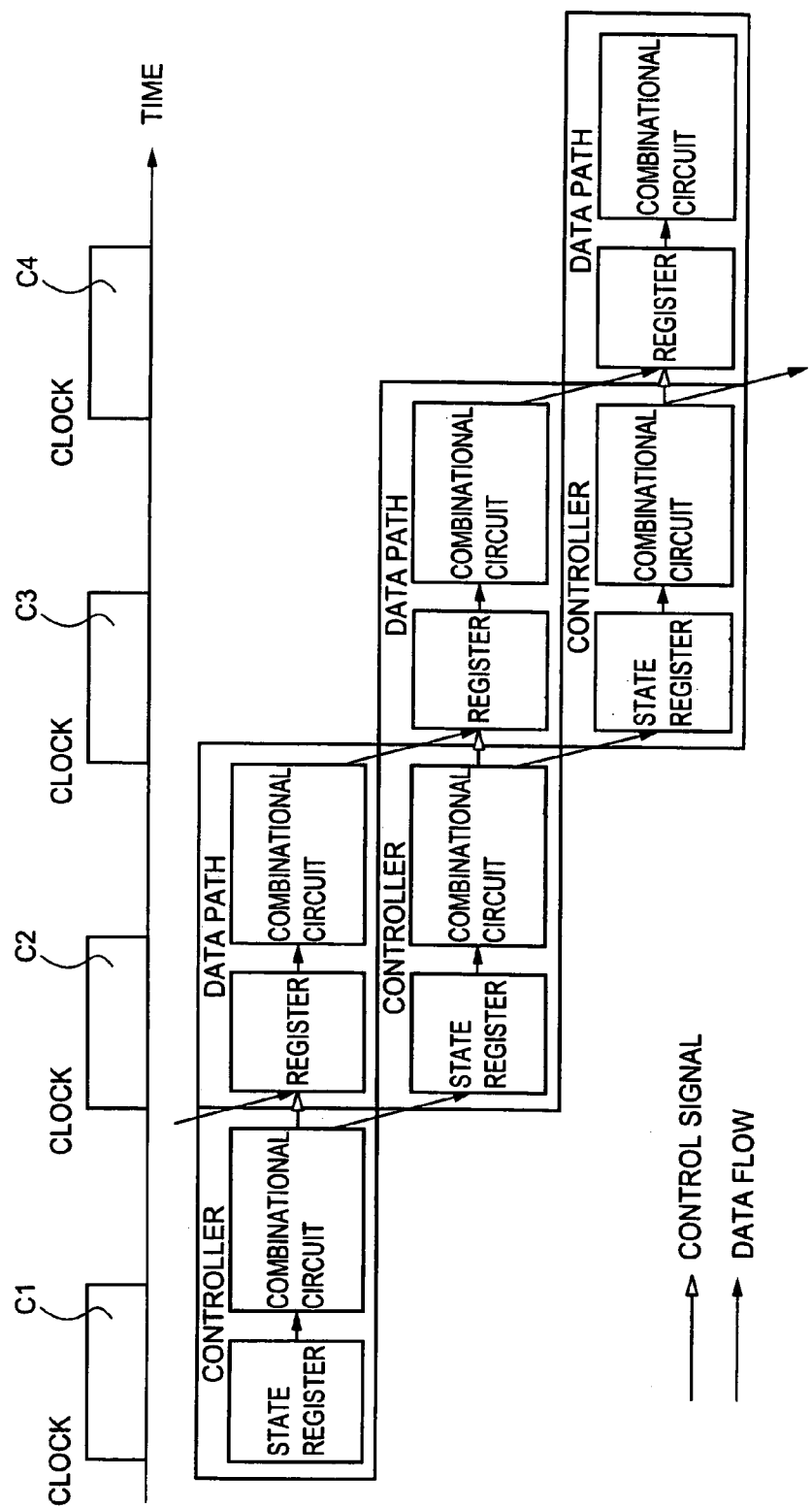
FIG. 19 is an illustration of an execution order (parallel operation) in hardware having a controller A and a data-path B.

Hardware circuitries each constituted by a controller and data path operate in parallel at clocks, as explained in the known technique with reference to FIG. 19.

Figure 20:
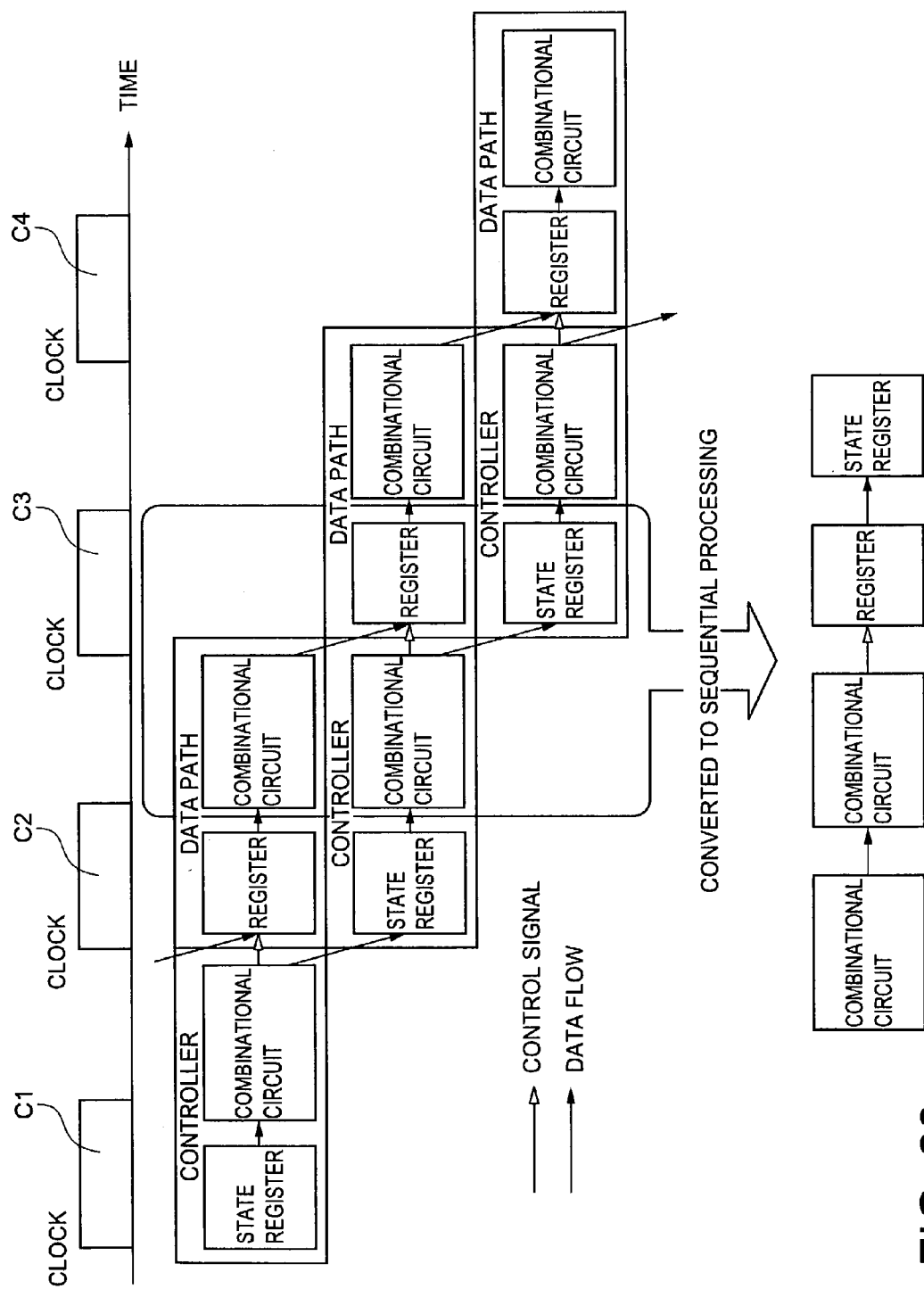
FIG. 20 is an illustration of an execution order of a programming language executable on computer, output from Verilog2C++, for the hardware shown in FIG. 19.

In the parallel operations in the known technique, circuits in the zone surrounded by a bold line in FIG. 20 are selected and arranged in a sequential order, thus being converted into a programming language executable on computer.

The output of the state register cannot be input to the control-signal output unit.

Therefore, even if "state" in the characteristics (1) is determined, a control signal at the time of determination cannot be uniquely determined. The data path in the characteristics (2), thus, cannot be controlled, resulting in unnecessary in operation but undeletable redundant processing being remained.

Figure 21:
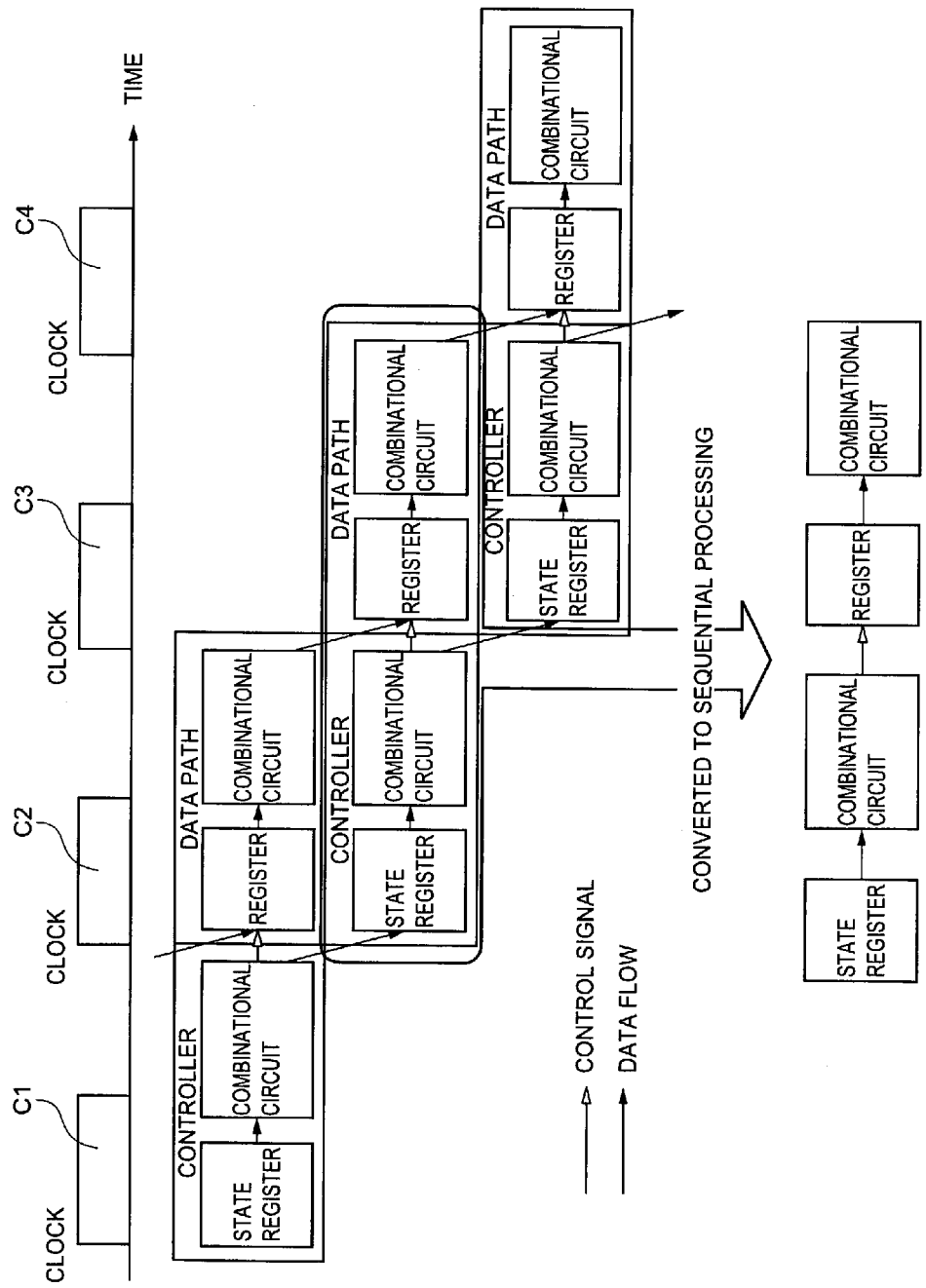
FIG. 21 is an illustration of an execution order (sequential operation) of a programming language executable on computer, output in the embodiment according to the present invention, for the hardware shown in FIG. 19.

On the contrary, in the embodiment, circuits in the zone surrounded by a bold line in FIG. 21 are selected and arranged in a sequential order, thus being converted into a programming language executable on computer.

Moreover, a former-state state register in the control-signal output unit is computed and output, thus the "state" defined in the characteristics (1) is determined. The control signal could also be determined uniquely. Once, the control signal is determined, it can be supplied to the data path at the next clock according to the characteristics (2), thus determining the operation of the data path in the current "state".

The determination on operation of data path is deletion of computational redundancy.

(1) Overall Architecture of Embodiment

Figure 1:
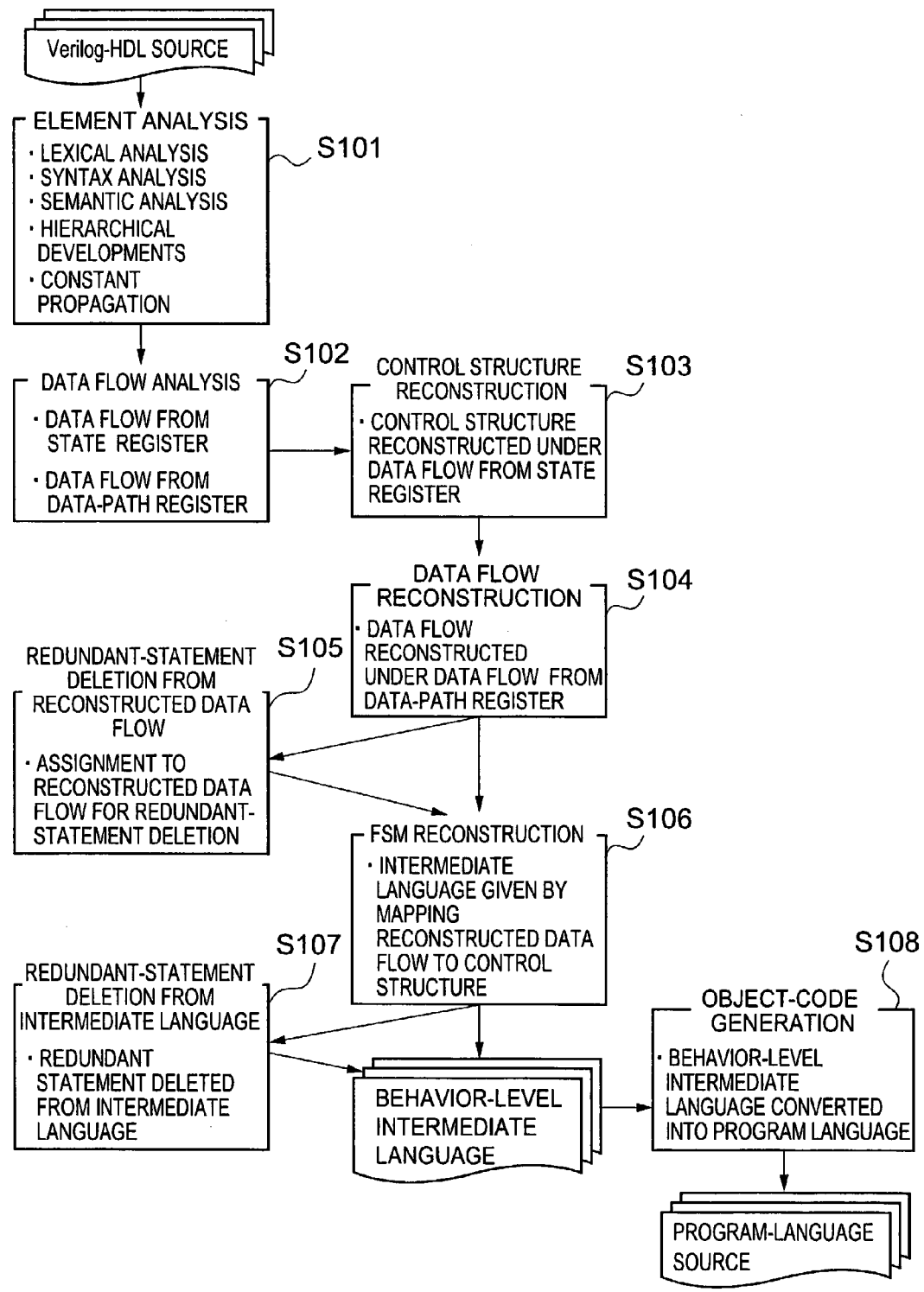
FIG. 1 is an exemplary flowchart showing several steps in an embodiment according to the present invention.

This embodiment is sequentially performed by computer units each depicted by a rectangular frame (FIG. 1).

The procedure in this embodiment consists of the following two major processes:

(1) Steps from element analysis (S101) to combination of control structure and data flow (S107) for conversion of RTL-Verilog-HDL to a behavior-level intermediate language. And, (2) Object-code generation step (S108) for conversion of the behavior-level intermediate language to a program language executable on computer.

Input data for conversion in this embodiment is a RTL-Verilog-HDL source. An entered source is subjected to lexical and syntax analysis to create a hierarchical Verilog-HDL data structure corresponding to source-module elements in an element analysis step (S101). After creating meaning of a signal by semantic analysis, the data structure is converted into a flat structure by hierarchical developments. The flat data structure is scanned for constant propagation.

Data flow from the state register and that from the data-path register are created based on the signal propagation in a data-flow analysis step (S102).

A control-structure reconstruction step (S103) is then executed to reconstruct the data flow created from the state register for control-structure reconstruction.

The data flow from the data-path register is reconstructed in a data-flow reconstruction step (S104) so that it is constituted only by circuitries which are to operate in each state in the control structure. The number of reconstructed data flows in this step is equal to that of states.

Redundant statements in the reconstructed data flows are deleted by assignment within each reconstructed data flow in a redundant-statement deletion step (S105) according to need.

Each reconstructed data flow is mapped in the corresponding state in the control structure to output a behavior-level intermediate language in a control-structure/data-flow combination step (S106). Redundant statements in the intermediate language are also deleted, according to need (S107).

The behavior-level intermediate language is then converted into a program language executable on computer in an object-code generation step (S108).

(Details of Each Step)

Each step shown in FIG. 1 will be disclosed in detail with exemplary RTL descriptions (sources) shown in FIGS. 22 to 26.

Figure 27:
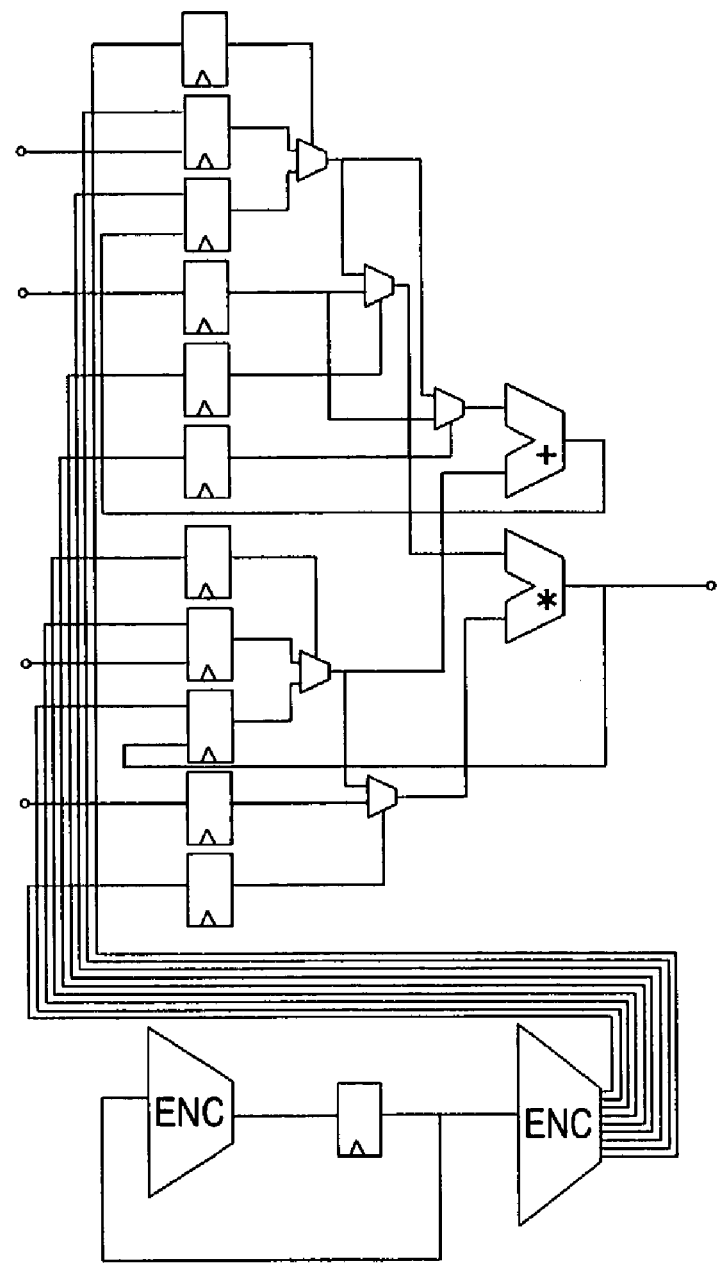
FIG. 27 is a circuit diagram of hardware employed in the embodiment according to the present invention.

The RTL description in each of FIGS. 22 to 26 describes the hardware shown in FIG. 27. The numbers on the left side in FIGS. 22 to 26 are line numbers in the RTL descriptions.

(2-1) Element Analysis Step (S101)

Figure 2:
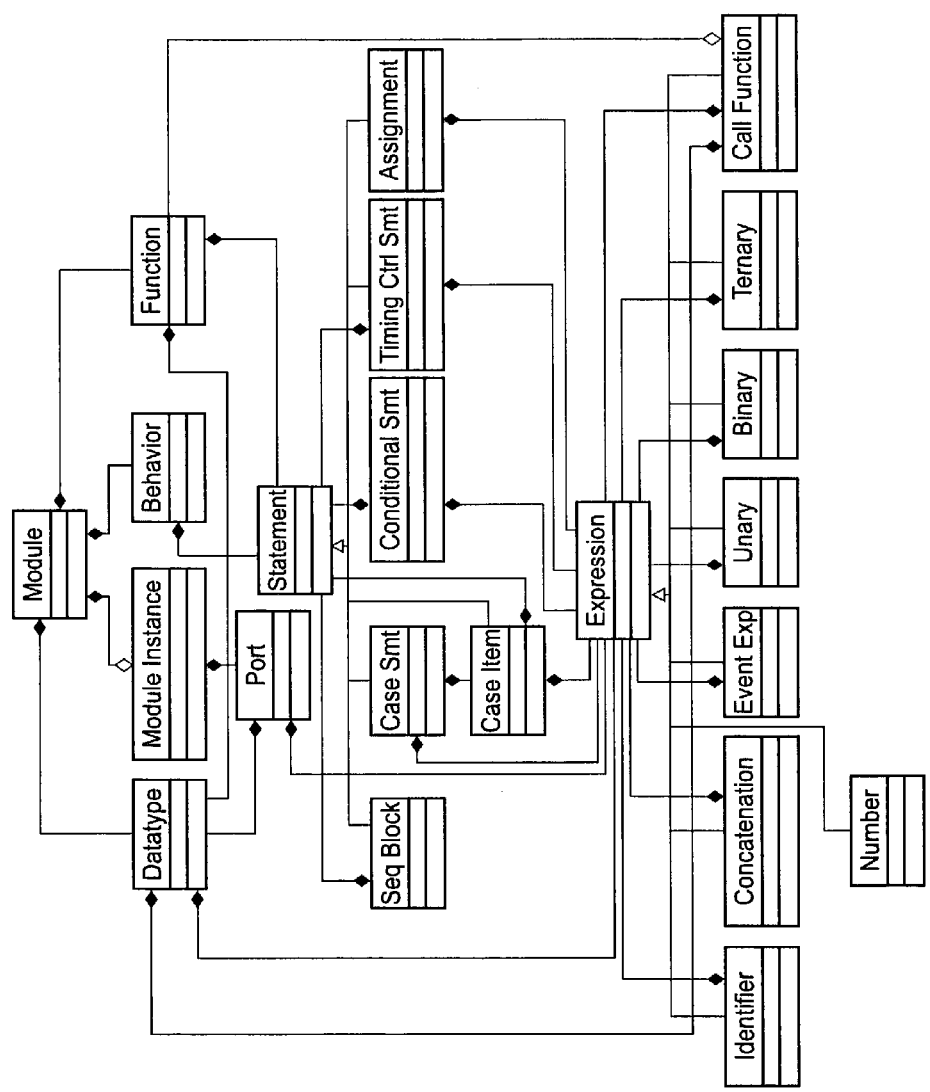
FIG. 2 is an exemplary class diagram constructed in an element analysis step in the embodiment according to the present invention.
Figure 3:
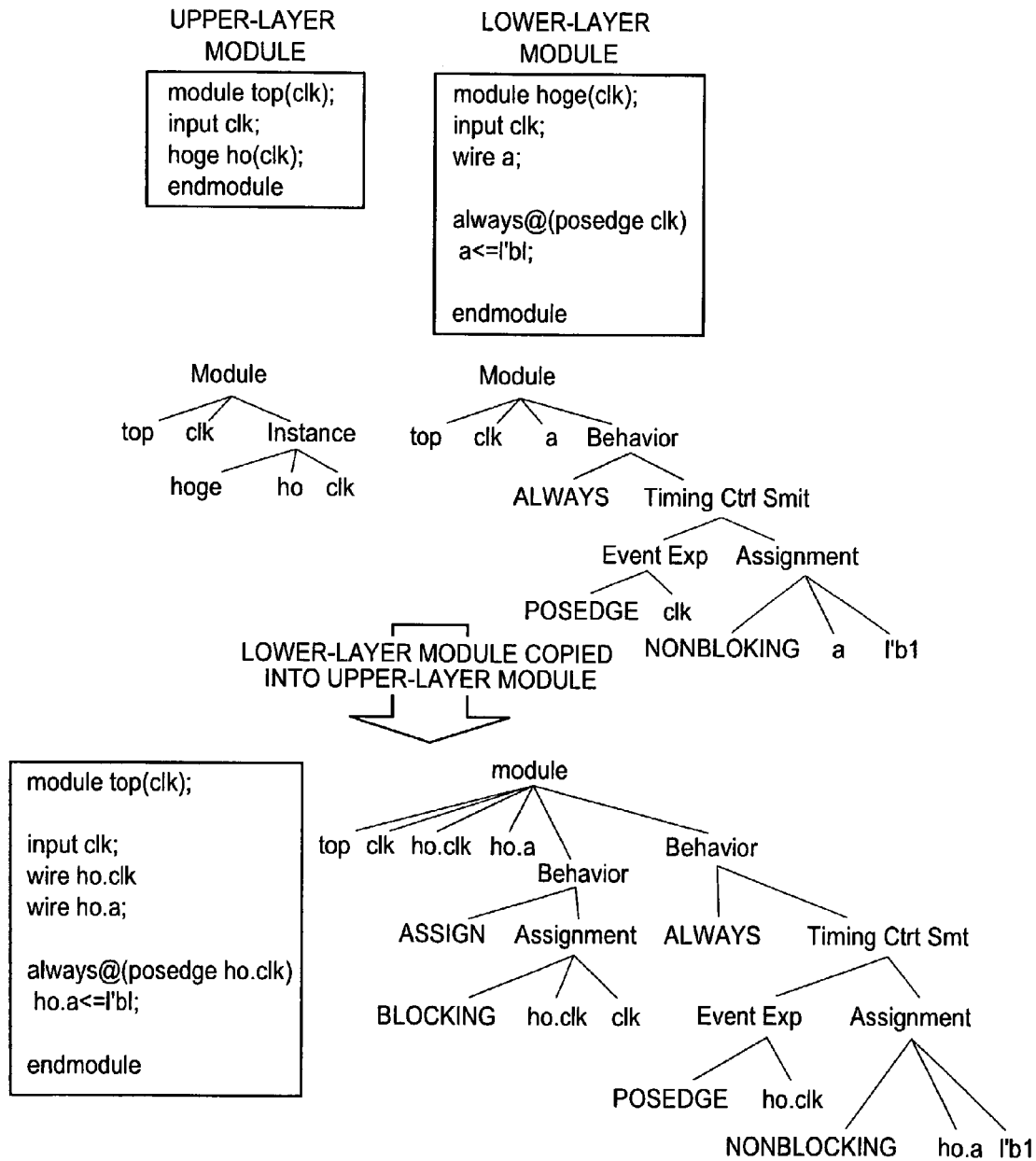
FIG. 3 is an exemplary hierarchical diagram in which a lower-layer module is copied into a high-layer module.

Disclosed first is the element analysis step with respect to FIGS. 2 and 3.

On installing a source program, all module elements involved in the program are extracted in the element analysis step.

The element analysis step (S101) consists of lexical, syntax and semantic analyses.

The lexical and syntax analyses construct a data structure corresponding to the module elements, with labeling to the state register which will operate in synchronism with a synchronization signal in the controller. Also performed in this step is conversion of all numerals into binary digits, which may, however, be performed in another step.

The semantic analysis identifies each signal used in hardware circuitries with the corresponding declaration expression to create meaning of the signal.

FIG. 2 shows an exemplary class diagram corresponding to the data structure.

Lower-layer modules are then copied into upper-layer modules one by one to convert the hierarchical module elements into a data structure with all module elements being copied into the upper-layer modules.

The data structure is depicted by the class diagram in this embodiment in construction of a data structure for a program under object-oriented design. Nevertheless, the class diagram is not a must in programming. Moreover, illustrated in FIG. 3 is an exemplary hierarchical development which is not an essential factor in this invention.

In copying the lower-layer modules into upper-layer modules, private signal names which are not input/output of the lower-layer modules, are added with instance names ("ho" in FIG. 3) at their heads to avoid duplication with signals names in other modules.

New assignment statements are created for connection of instance ports in the upper-layer modules and ports the in lower-layer modules. In FIG. 3, a statement "ASSIGNMENT" is newly created and added in the upper-layer module.

In connection of synchronization signals, a signal, for which the name of a destination to be connected has been changed, is handled as a synchronization signal. In FIG. 3, when "clk" is a synchronization signal, "ho.clk" is also handled as a synchronization signal. State-register labeling has to be maintained.

The flat data structure is then scanned for constant propagation. Replaced with constants in the constant propagation are statements, the right side of which is expressed with constants, to which output signals are input from circuitries mainly constructed by parameter statements.

(2-2) Data-Flow Analysis Step (S102)

Figure 4:
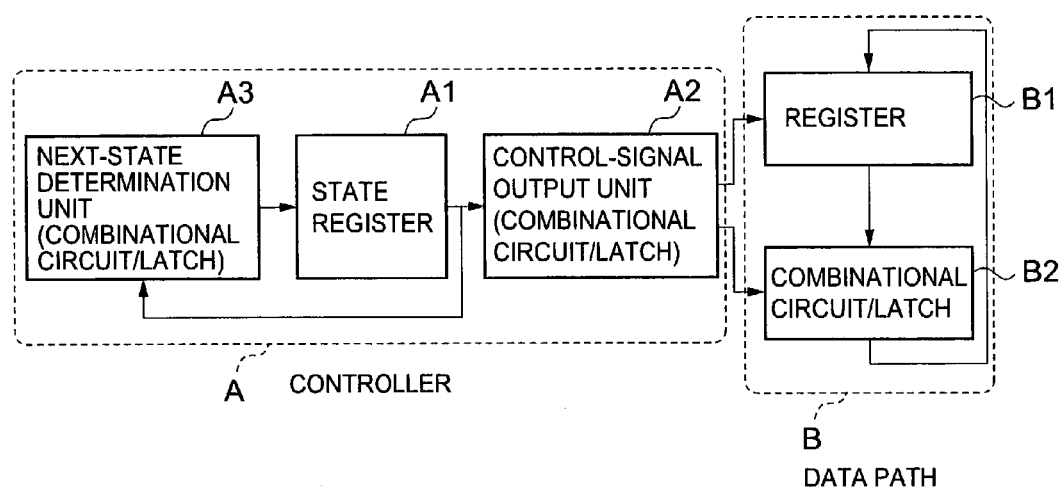
FIG. 4 is an exemplary RTL circuitry.

A basic RTL-HDL consists of a controller A and a data path B, such as, shown in FIG. 4. The former controls the latter which performs computation. Arrows in FIG. 4 indicate signal flows.

In FIG. 4, the controller A mainly consists of a state register A1, a control-signal output unit A2 (combinational circuit/latch) for outputting a control signal, depending on the current state or input, and a next-state determination unit A3 (combinational circuit/latch) for determining the next state.

The data path B mainly consists of a register B1 and a combinational circuit/latch B2, operating in accordance with the output from the controller A.

In operation, the register B1 activates the combinational circuit/latch B2, under control by the control signal supplied to the register B1 from the control-signal output unit A2.

Figure 28:
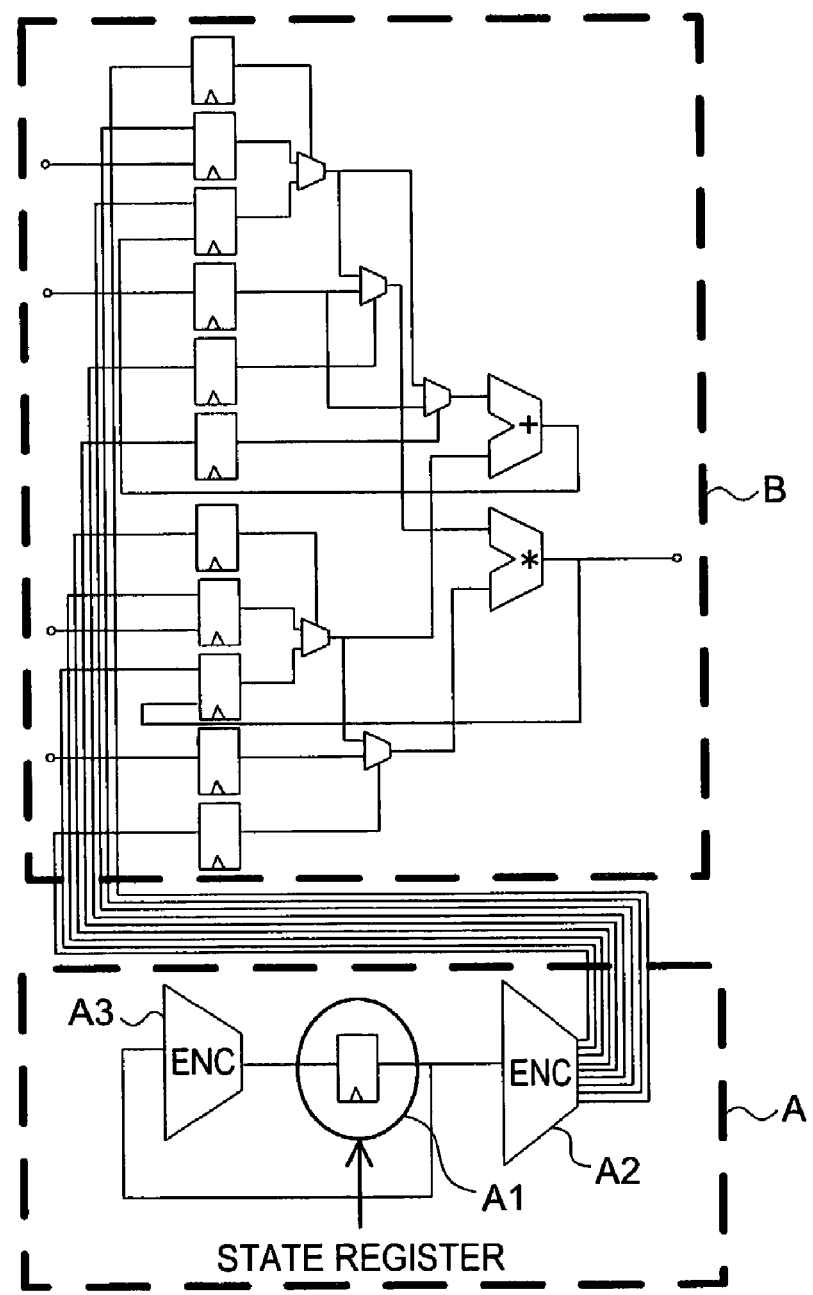
FIG. 28 is a circuit diagram of a state register selected in a state-register selection step in a data-flow analysis step in the embodiment according to the present invention.

Illustrated in FIG. 28 are a controller A and a data path B that constitute the hardware shown in FIG. 27.

The data-flow analysis step (S102) shown in FIG. 1 executes a creation step (FIG. 7) for creating a data flow from the state register A1 in the controller A, a creation step (FIG. 8) for creating a data flow from the register B in the data path B, and a creation step (FIG. 9) for creating a data flow from an external input signal. Each data-flow creation step will be disclosed.

(2-2-1) Creation of Data flow from State Register

Creation of a data flow from a state register will be disclosed with reference to FIGS. 4 to 7.

Figure 5:
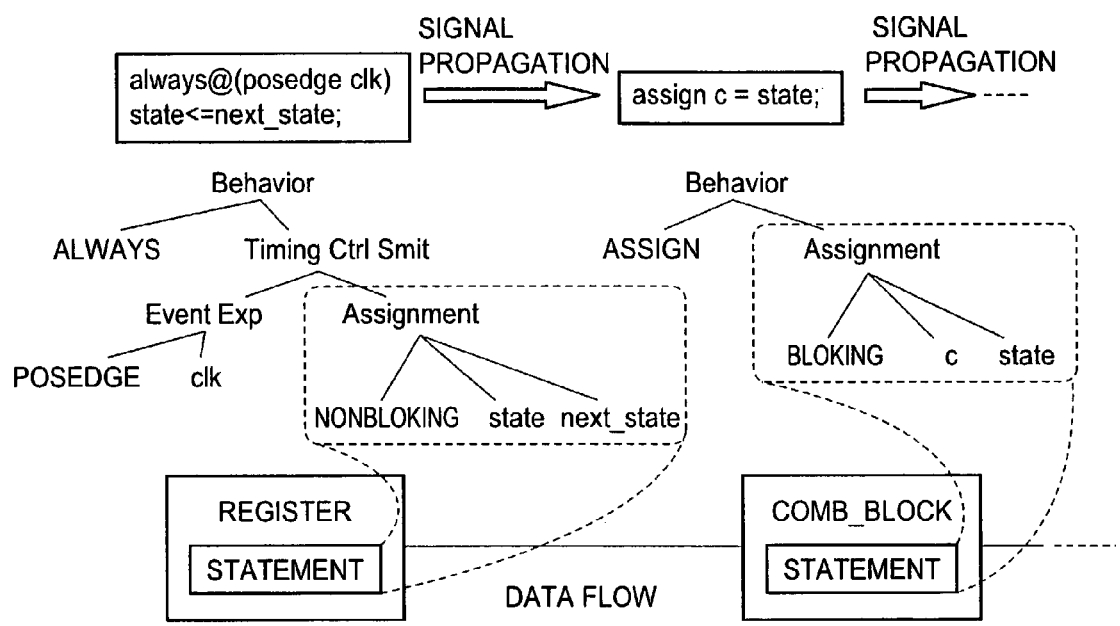
FIG. 5 is an exemplary illustration of source/data-flow correspondence.

The data-flow analysis step (S102) creates a data flow from a state register, as shown in FIG. 5, based on elements output in the element analysis step (S101).

Figure 6:
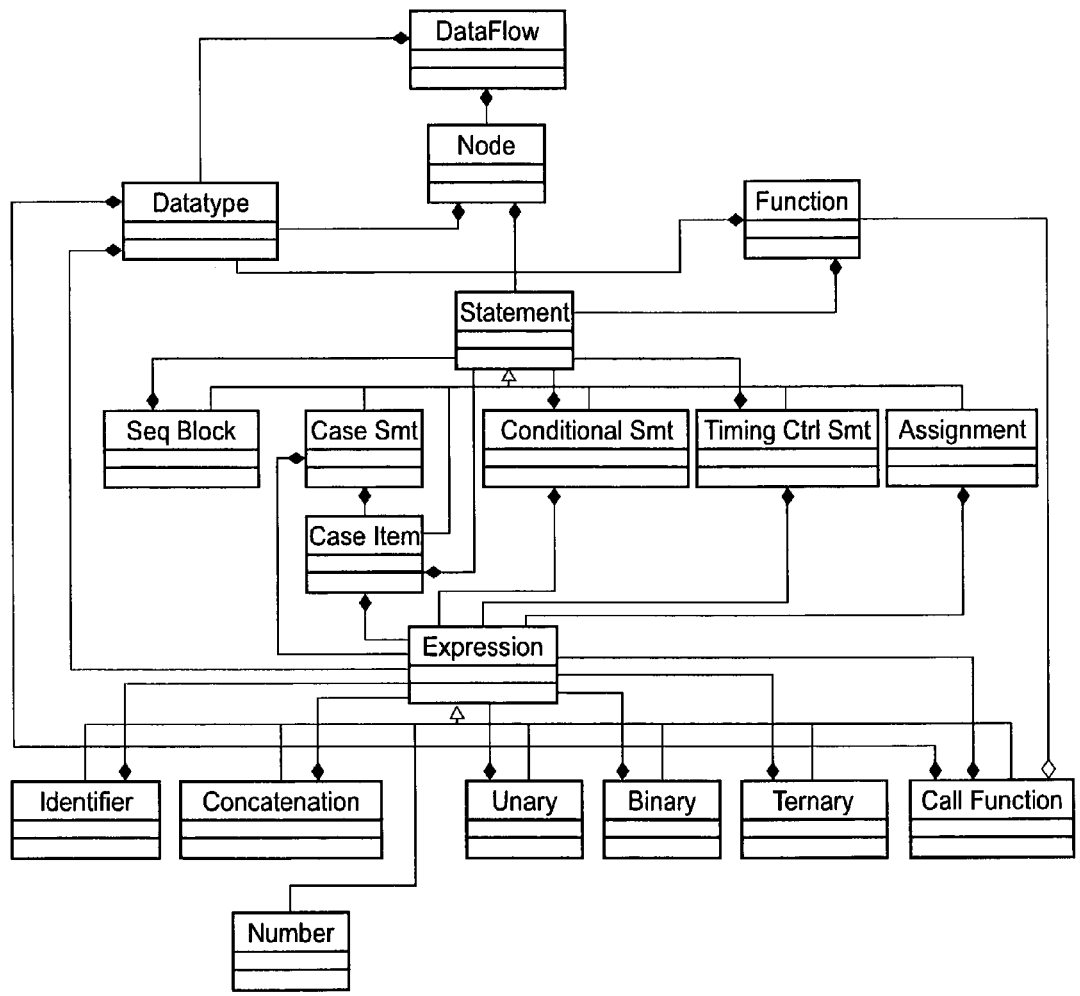
FIG. 6 is an exemplary class diagram constructed in a data-flow analysis step in the embodiment according to the present invention.

Illustrated in FIG. 6 is an exemplary class diagram corresponding to the data structure.

In FIG. 5, a data flow is created by propagation of a signal "state". Unnecessary components, such as, "ALWAYS" and "EventExp", are deleted from the data structure for constructing a data structure with information composing statements only, the constructed data structure being elements of the data flow.

While the unnecessary components are deleted, information for determining whether each statement is "register" or "combinational circuit/latch" is added to the constructed data structure. The data structure shown in FIG. 5 consists, only, of tree structures representing statements after the class "Assignment" and the information determining whether each statement is "register" or "combinational circuit/latch".

As a result of the foregoing procedure, deleted from the class diagram shown in FIG. 2 are classes, such as, "EventExP", and also "Module", "ModuleInstance" and "Port" each indicating a hierarchical procedure. Instead, stored in "Node" is the information extracted from "EventExP", which determines whether each statement is "register" or "combinational circuit/latch".

Information to be selected as "statement", deletion of classes from the class diagram in FIG. 2 and storage on "Node" are just examples in this embodiment, and thus not limited to the invention.

Figure 7:
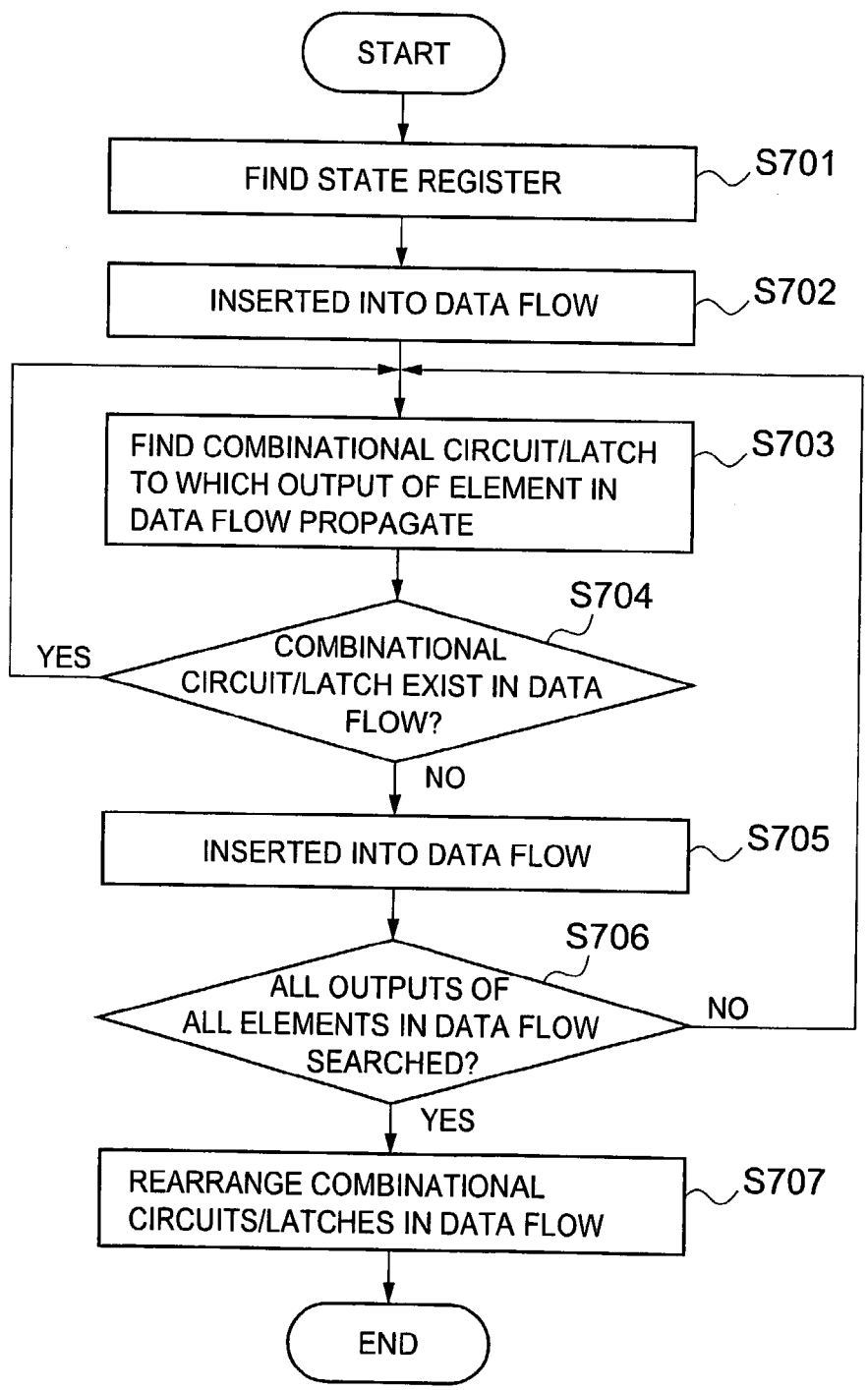
FIG. 7 is an exemplary flowchart showing a state-register-originated data-flow creation step in the embodiment according to the present invention.

Shown in FIG. 7 is a flow chart indicating the data-flow analysis step (S102).

A state register is found (S701) based on the labeling in the element analysis (S101) and inserted into the data flow (S702).

Found next is "combinational circuit/latch" to which the output of the state register is to propagate (S703). If "combinational circuit/latch" in not found in the data flow (NO in S704), it is inserted into the data flow (S705).

This embodiment does not allow duplication of "combinational circuit/latch" in one data flow. This is because one or more of duplicates poses a problem in that the output of the last-stage combinational circuit will be overwritten on the output of each previous combinational circuit. Thus, those other than the last-stage combinational circuit will be of useless.

In the flow chart shown in FIG. 7, the circuitries corresponding to "combinational circuit/latch" are the control-signal output unit A2 and the next-state determination unit A3.

When all "combinational circuits/latches" to which the output of the state register is to propagate have been inserted into the data flow (S706), "combinational circuits/latches" are rearranged in the data flow in order so that the input of "combinational circuit/latch", an anterior element in the data flow, will not become the output of "combinational circuit/latch", a posterior element in the data flow, and the process ends (S707).

The rearrangement aligns the elements in the data flow in order of a flow of data for conversion into a program language, such as, Language C, executable on computer, in accordance with the data flow.

Created accordingly is the data flow from the state register, or that constituted by the state register and "combinational circuit/latch", in the data-flow analysis step (S102).

Data-flow creation will further be disclosed.

EXAMPLE

Creation of Data Flow from State Register

Creation of a data flow from a user-appointed state register to a program is as follows:

Found first is a state register indicated by the following source code 1 with line numbers 25 and 27 in the RTL description shown in FIGS. 22 to 26 and inserted into a data flow. The state register corresponds to A1 shown in FIG. 28.

Figure 29:
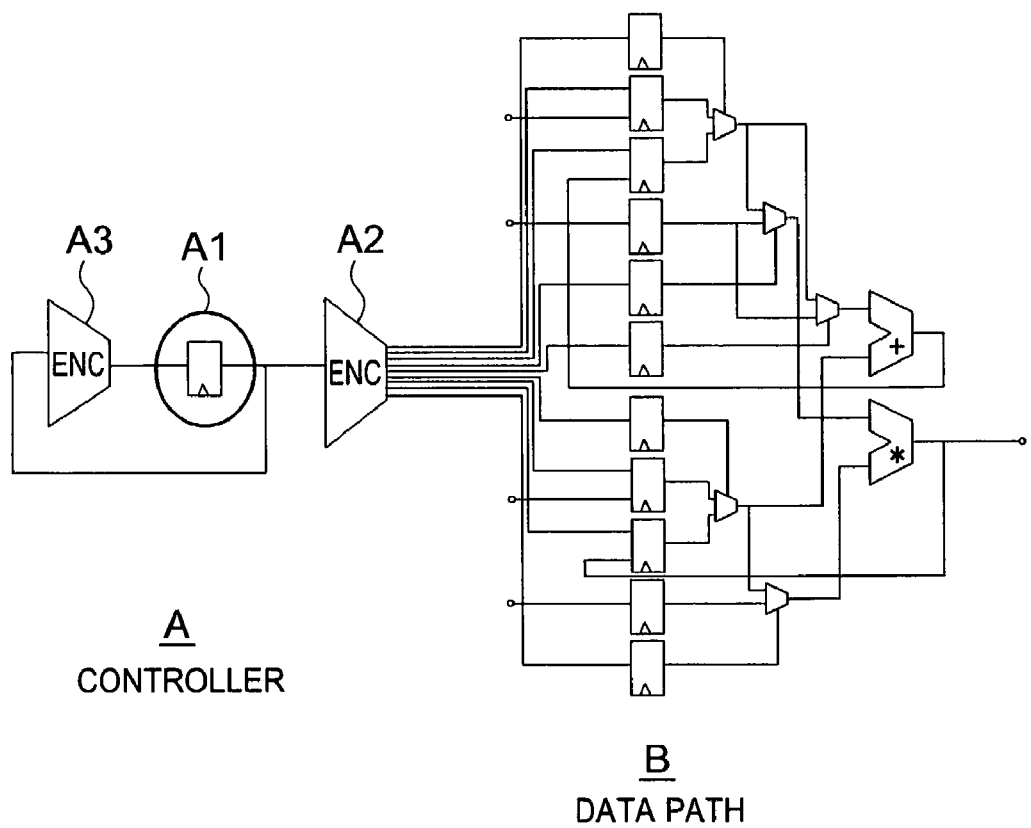
FIG. 29 is a circuit diagram of hardware corresponding to a state-register-originated data-flow creation step in the embodiment according to the present invention.

(Source Code 1)
25: //state register
27: state<=next_state;

Found next and inserted into the data flow is "combinational circuit/latch" to which the output signal of the state register is to propagate. Here in this example, those found and inserted into the data flow are a control-signal output unit and a next-state determination unit indicated by the following source code 2 with line numbers 30 to 81 in the RTL description shown in FIGS. 22 to 26. The control-signal output unit and the next-state determination unit correspond to A2 and A3, respectively, shown in FIGS. 28 and 29.

|  | (Source Code 2) |
|---|---|
| 30 : | //control-signal output unit |
| 32 : | case (state) |
| 33 : | 0:begin |
| 34 : | m1c <= 1'b0; |
| 35 : | m2c <= 1'b0; |
| 36 : | m3c <= 1'b0; |
| 37 : | v3c <= 1'b1; |
| 38 : | v4c <= 1'b1; |
| 39 : | v6c <= 1'b0; |
| 40 : | v5c <= 1'b0; |
| 41 : | a_mux_c <= 1'b1; |
| 42 : | b_mux_c <= 1'b1; |
| 43 : | end |
| 44 : | 1:begin |
| 45 : | m1c <= 1'b1; |
| 46 : | m2c <= 1'b1; |
| 47 : | m3c <= 1'b1; |
| 48 : | v3c <= 1'b0; |
| 49 : | v4c <= 1'b0; |
| 50 : | v6c <= 1'b1; |
| 51 : | v5c <= 1'b1; |
| 52 : | a_mux_c <= 1'b0; |
| 53 : | b_mux_c <= 1'b0; |
| 54 : | end |
| 55 : | 2:begin |
| 56 : | m1c <= 1'b0; |
| 57 : | m2c <= 1'b0; |
| 58 : | m3c <= 1'b0; |
| 59 : | v3c <= 1'b0; |
| 60 : | v4c <= 1'b0; |
| 61 : | v6c <= 1'b1; |
| 62 : | v5c <= 1'b1; |
| 63 : | a_mux_c <= 1'b0; |
| 64 : | b_mux_c <= 1'b0; |
| 65 : | end |

|  | -continued |
|---|---|
| 66 : | endcase |
| 69 : | //next-state determination unit |
| 71 : | case (state) |
| 72 : | 0:begin |
| 73 : | next_state <= 1; |
| 74 : | end |
| 75 : | 1:begin |
| 76 : | next_state <= 2; |
| 77 : | end |
| 78 : | 2:begin |
| 79 : | next_state <= 0; |
| 80 : | end |
| 81 : | endcase |

(2-2-2) Creation of Data flow from Data-Path Register

Figure 8:
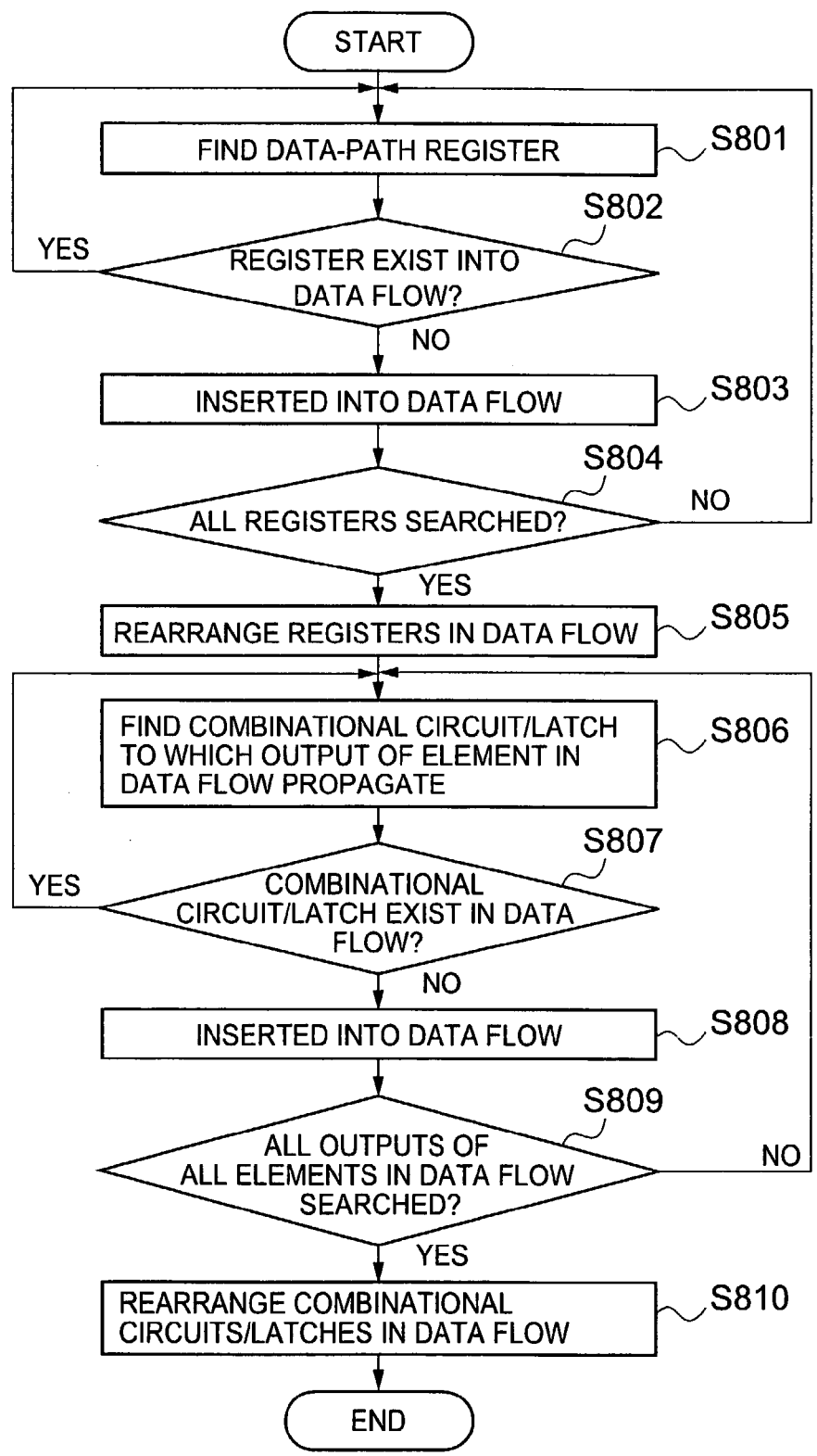
FIG. 8 is an exemplary flowchart showing a data-path-register-originated data-flow creation step in the embodiment according to the present invention.

Creation of a data flow from a data-path register B1 will be disclosed with reference to FIG. 8. The data-path register B1 is a register operable in synchronism with a synchronization signal in the data path B.

Found first is a register in the data path B (S801). It is inserted into a new data flow different from the one created from the state register A1 (S803). No insertion is performed if it has already existed in the data flow (S802).

When all data-path register have been inserted into the data flow (YES in S804), rearrangement is performed so that the output of a register, an anterior element in the data flow, will not become the input of another register, a posterior element in the data flow (S805).

The rearrangement is an essential step for conversion into a program language, such as, Language C, executable on computer, in accordance with the data flow.

This is because a data flow in which the output of a register, an anterior element in the data flow, is the input of another register, a posterior element in the data flow, will contradict, if executed in order, with an HDL data flow that expects these register will operate simultaneously.

Found next is "combinational circuit/latch" to which the output of the data-path register inserted into the data flow is to propagate (S806). If "combinational circuit/latch" is not found in the data flow (NO in S807), it is inserted into the data flow (S808).

When all "combinational circuits/latches" to which a signal propagates have been inserted into the data flow (YES in S809), insertion of circuitry in data flow is completed, rearrangement of "combinational circuits/latches" in the data flow is performed in the same way as the state-register-originated data-flow creation (S810), and the process ends.

Created accordingly is the data flow constituted by the data-path registers and "combinational circuits/latches".

Example 1

Order of Data-Path Register Data Flow

The data flow in this embodiment is not allowed to have the following register order:

(Source Code 3)
a<=in;
out<=a;

This is because the order indicated above will initiate assignment to a signal "a", thus a signal "in" being directly passed to a signal "out" when converted into a program, such as Language C, executable on computer. The signal "in" will not be directly passed to the signal "out" in actual hardware in which two registers synchronizing with a rising moment of the same synchronization signal will simultaneously operate at the rising moment and then brought into a halt thereafter.

Such a problem is overcome with rearrangement to the resisters as follows:

(Source Code 4)

out<=a;

a<=in;

The register order shown below will have contradiction with hardware.

(Source Code 5)

out<=in;

in<=out;

Such contradiction can be avoided with creation of a temporal variable as shown below:

(Source Code 6)

tmp_out<=in;

in<=out;

out=tmp_out;

Example 2

Exemplary Data-Path Register Data Flow

Listed as Source Code 7 below is an exemplary data flow from data-path registers to a program with the RTL description shown in FIGS. 22 to 26.

The numerals listed on the left side of the data flow are line numbers assigned to the RTL description shown in FIG. 22 to 26. The former part of the data flow is constituted by registers whereas the latter part "combinational circuits/latches". It is clear that Source Code 7 has no problems due to register order or selection of the same "combinational circuit/latch".

```
(Source Code 7)
<REGISTER>
109 :   b_mux_c_out <=b_mux_c;
105 :   a_mux_c_out <=a_mux_c;
101 :   v2_out <=v2_in;
97 :    v1_out <=v1_in;
113 :   if((v3c==1'b1))
114 :     v3_out <=v3_in;
118 :   if((v4c==1'b1))
119 :     v4_out <=v4_in;
93 :    m3c_out <=m3c;
89 :    m2c_out <=m2c;
85 :    m1c_out <=m1c;
128 :   if((v6c==1'b1))
129 :     v6_out <=add_out;
123 :   if((v5c==1'b1))
124 :     v5_out <=mul_out;
<COMB_BLOCK>
134 :   b_mux_out =((b_mux_c_out==1'b1)? v3_out : v5_out);
132 :   a_mux_out =((a_mux_c_out==1'b1)? v4_out : v6_out);
140 :   mu3_out =((m3c_out==1'b1)? a_mux_out : v2_out);
144 :   {_add_tmp,add_out} =(mu3_out+b_mux_out);
136 :   mu1_out =((m1c_out==1'b1)? v1_out : b_mux_out);
138 :   mu2_out =((m2c_out==1'b1)? v2_out : a_mux_out);
142 :   {_mul_tmp,mul_out} =(mu1_out*mu2_out);
```

(2-2-3) Creation of Data Flow from External Input Signal

Figure 9:
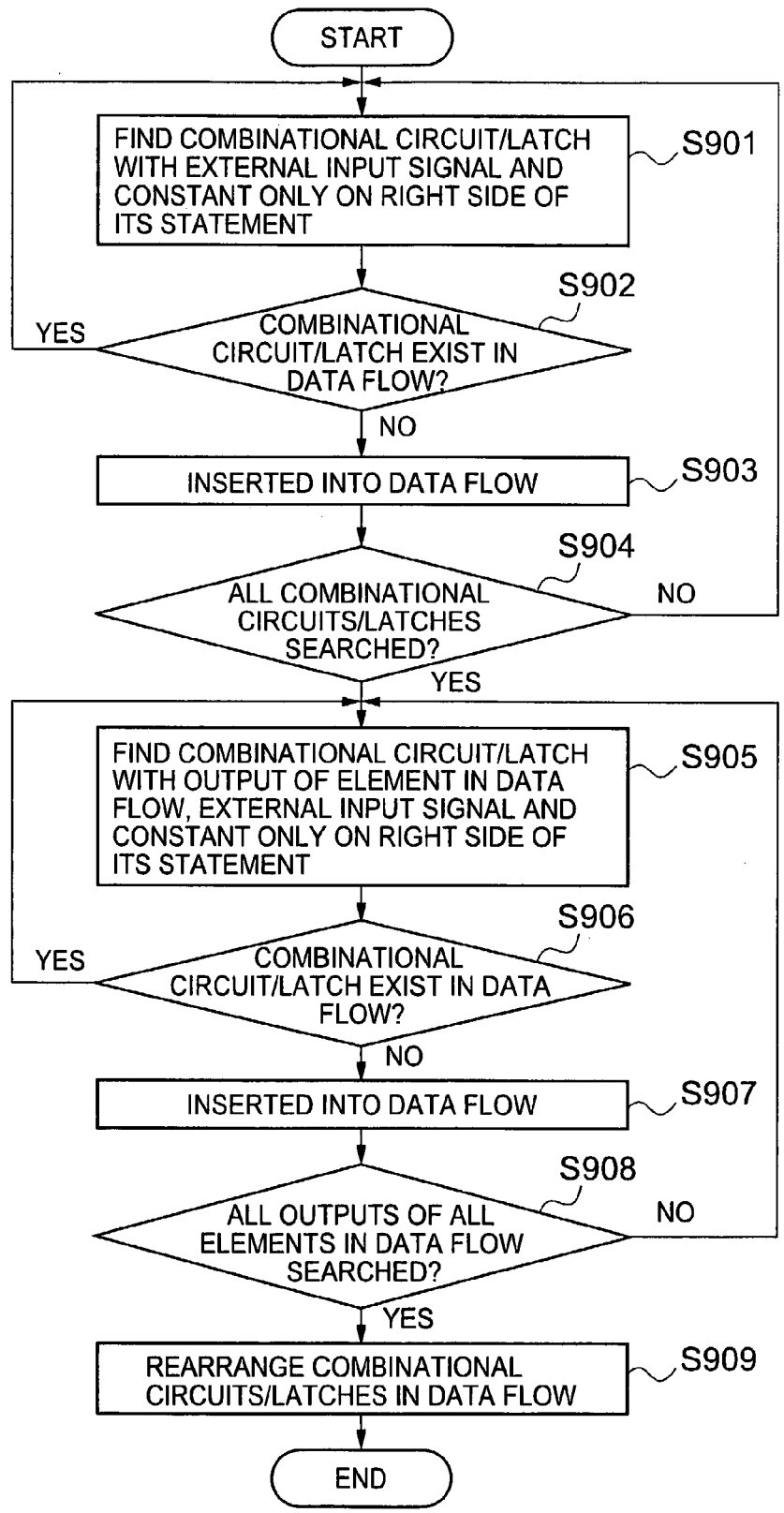
FIG. 9 is an exemplary flowchart showing an external-input-signal-originated data-flow creation step in the embodiment according to the present invention.

Disclosed next with reference to a flow chart show in FIG. 9 is creation of a data flow from an external input signal based on the data-flow analysis step (S102).

Founded first is "combinational circuit/latch" having only an external signal and constant on the right side of its statement (S901). The "combinational circuit/latch" is inserted into a new data flow (S902). No insertion is performed if it has already existed in the data flow (YES in S902).

When all "combinational circuits/latches" have been inserted (YES in S904), founded next are "combinational circuits/latches" each having only the output signal of inserted circuitry, an external signal and constant on the right side of its statement (S905). They are also inserted into the data flow (S907). No insertion is performed if they have already existed in the data flow (YES in S906).

One requirement in this process is no insertion of one or more duplicates of circuitry in the data flow, like the other data-flow creation steps.

When all outputs of all elements in the data flow have been found (YES in S908), the elements are rearranged in order so that the input of an anterior element of the data flow will not become the output of a posterior element in the data flow (S909), like the other data-flow creation steps, and the process ends.

(2-3) Control-Structure Reconstruction Step (S103)

Figure 10:
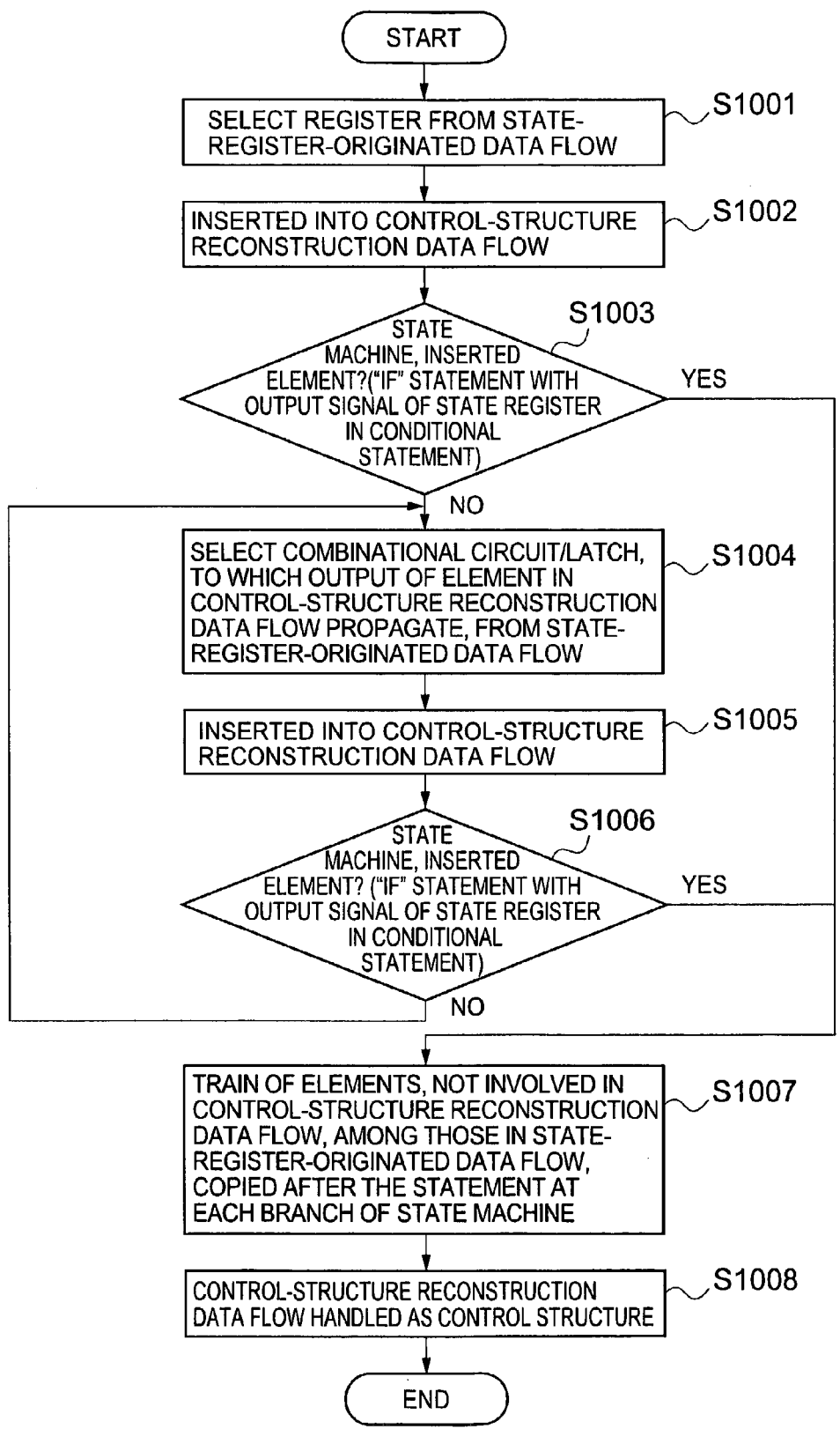
FIG. 10 is an exemplary flowchart showing a control-structure reconstruction step in the embodiment according to the present invention.

The control-structure reconstruction step (S103) will be disclosed with reference to FIG. 10.

Control structure is reconstructed based on the data flow created from the state register A1 when the data flows have been created from the state register A1, the register B1 in the data path and the external input signal in the data-flow analysis step (S102).

One requirement for bringing out the existence of states and transition between the states is to grasp the control structure of hardware. It is grasped by analyzing the state register, control-signal output unit and next-state determination unit. The data flow constituted by the state register, control-signal output unit and next-state determination unit corresponds to that constituted by the state registers created in the data-flow analysis step (S102).

Shown in FIG. 10 is a flow chart indicating the control-structure reconstruction step.

State registers are selected (S1001) from the data flow created from the state registers obtained in the data-flow analysis step (S102).

The selected state registers are inserted into a control-structure reconstruction data flow, a new data flow (S1002).

A state register is defined as a finite state machine (FSM) when it is expressed with an "if" statement and the output signal of the state register is involved in a conditional statement (corresponding to a conditional of "if" and "case" statements or label to a "case" statement).

If the selected state register is not an FSM (NO in S1003), a "combinational circuit/latch" to which the output of the state register is to propagate is selected from the data flow created from the state register (S1004).

The selected "combinational circuit/latch" is inserted into the control-structure reconstruction data flow (S1005).

It is determined whether the selected "combinational circuit/latch" is an FSM according to whether it is expressed with "if" and "case" statements and the output signal of "combinational circuit/latch" is involved in a conditional expression (corresponding to a conditional expression of "if" and "case" statements or a label to a "case" statement).

When FSM has been found (YES in S1003 and S1006), a train of elements, not involved in the control-structure reconstruction data flow, among those in the data flow created from the state register, is copied after the statement at each branch of a found FSM (S1007).

Each branch in an FSM can be handled as a state. The control-structure reconstruction data flow created as above is handled as a control structure (S1008).

EXAMPLE

Extraction of FSM as Control Structure

In a general RTL-HDL, a controller A is configured so that it meets the requirements described with FSM.

An FSM is a control structure in the following description.

An FSM is generally constituted by a state register A1, a control-signal output unit A2 and a next-state determination unit A3.

In other words, the FSM can be extracted by analyzing a data flow involving the state register A1, the control-signal output unit A2 and the next-state determination unit A3.

An FSM extracted in the exemplary step of creating a data flow from the state register A1 is expressed with a source code 8 listed below. The left-side numerals for the extracted FSM are line numbers in the RTL description shown in FIGS. 22 to 26.

The next-state determination unit A3 has been copied into the control-signal output unit A2, converted into a simple statement with computation of conditionals.

Figure 30:
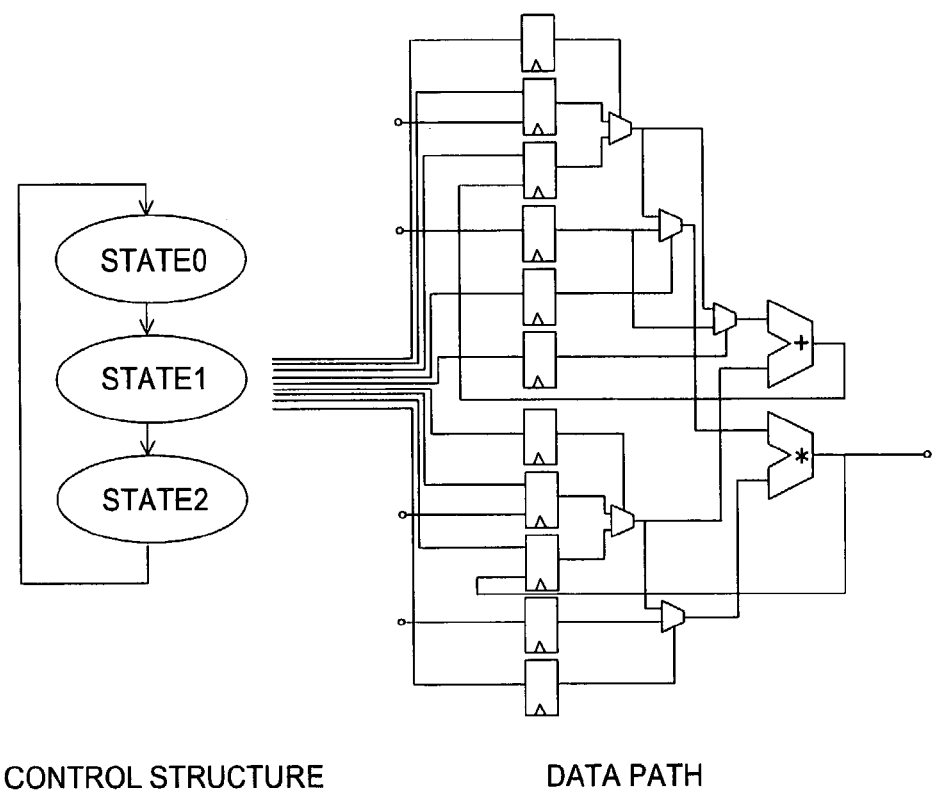
FIG. 30 is an illustration of a state of a state machine (FMS) obtained in a control-structure reconstruction step in the embodiment according to the present invention.

A state of the extracted FSM is illustrated in FIG. 30.

```
                (Source Code 8)
    27 :    state <= next_state;
    32 :    case (state)
    33 :      0:begin
    34 :        m1c <= 1'b0;
    35 :        m2c <= 1'b0;
    36 :        m3c <= 1'b0;
    37 :        v3c <= 1'b1;
    38 :        v4c <= 1'b1;
    39 :        v6c <= 1'b0;
    40 :        v5c <= 1'b0;
    41 :        a_mux_c <= 1'b1;
    42 :        b_mux_c <= 1'b1;
    73 :        next_state <= 1;
    43 :      end
    44 :      1:begin
    45 :        m1c <= 1'b1;
    46 :        m2c <= 1'b1;
    47 :        m3c <= 1'b1;
    48 :        v3c <= 1'b0;
    49 :        v4c <= 1'b0;
    50 :        v6c <= 1'b1;
    51 :        v5c <= 1'b1;
    52 :        a_mux_c <= 1'b0;
    53 :        b_mux_c <= 1'b0;
    76 :        next_state <= 2;
    54 :      end
    55 :      2:begin
    56 :        m1c <= 1'b0;
    57 :        m2c <= 1'b0;
    58 :        m3c <= 1'b0;
    59 :        v3c <= 1'b0;
    60 :        v4c <= 1'b0;
    61 :        v6c <= 1'b1;
    62 :        v5c <= 1'b1;
    63 :        a_mux_c <= 1'b0;
    64 :        b_mux_c <= 1'b0;
    79 :        next_state <= 0;
    65 :      end
    66 :    endcase
```

Figure 11:
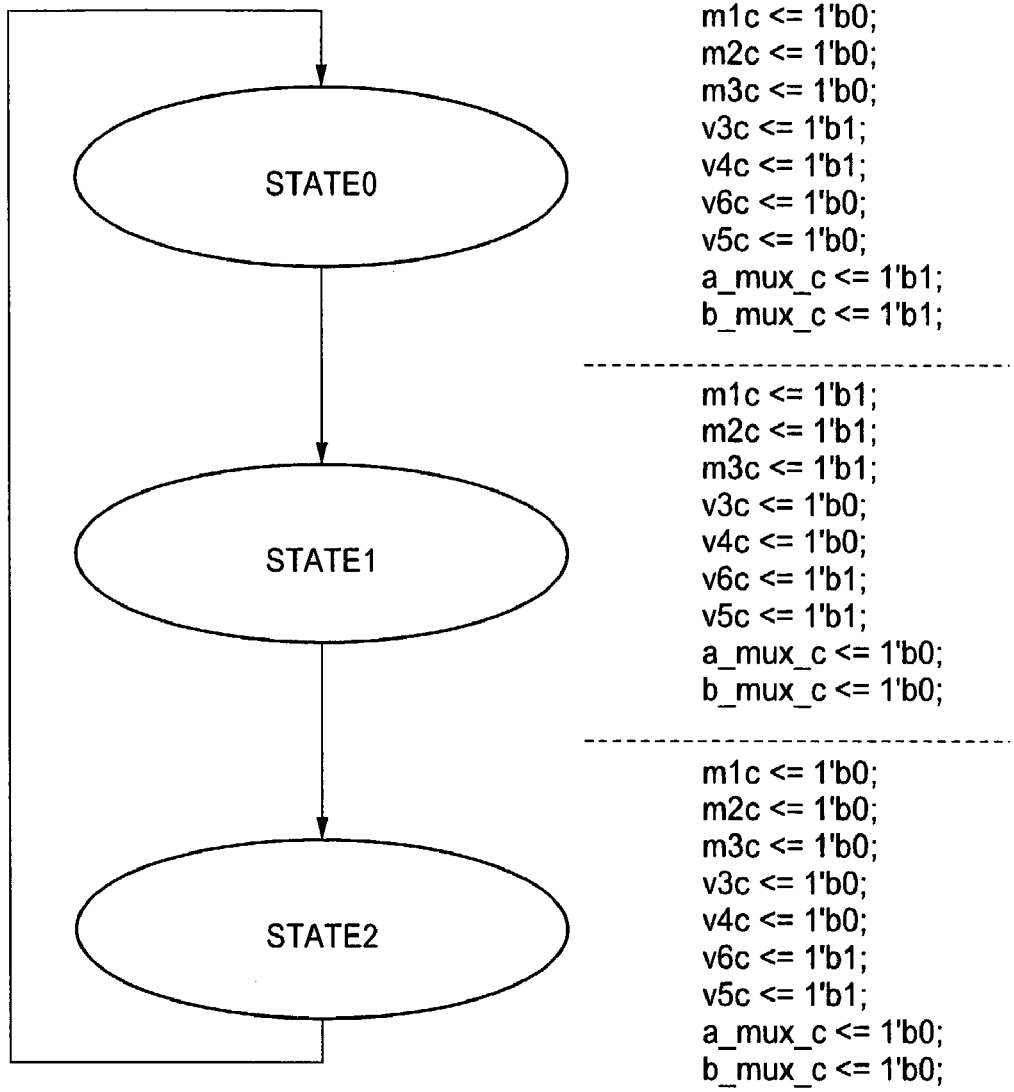
FIG. 11 is an exemplary illustration of FSM extracted in control-structure reconstruction and extraction steps.

Illustrated in FIG. 11 is state transition of the extracted FSM. Shown in FIG. 11 are states STATE 0, STATE 1 and STATE 2, and an output statement for a control signal in each state.

(2-4) Data-Flow Reconstruction Step (S104)

Figure 12:
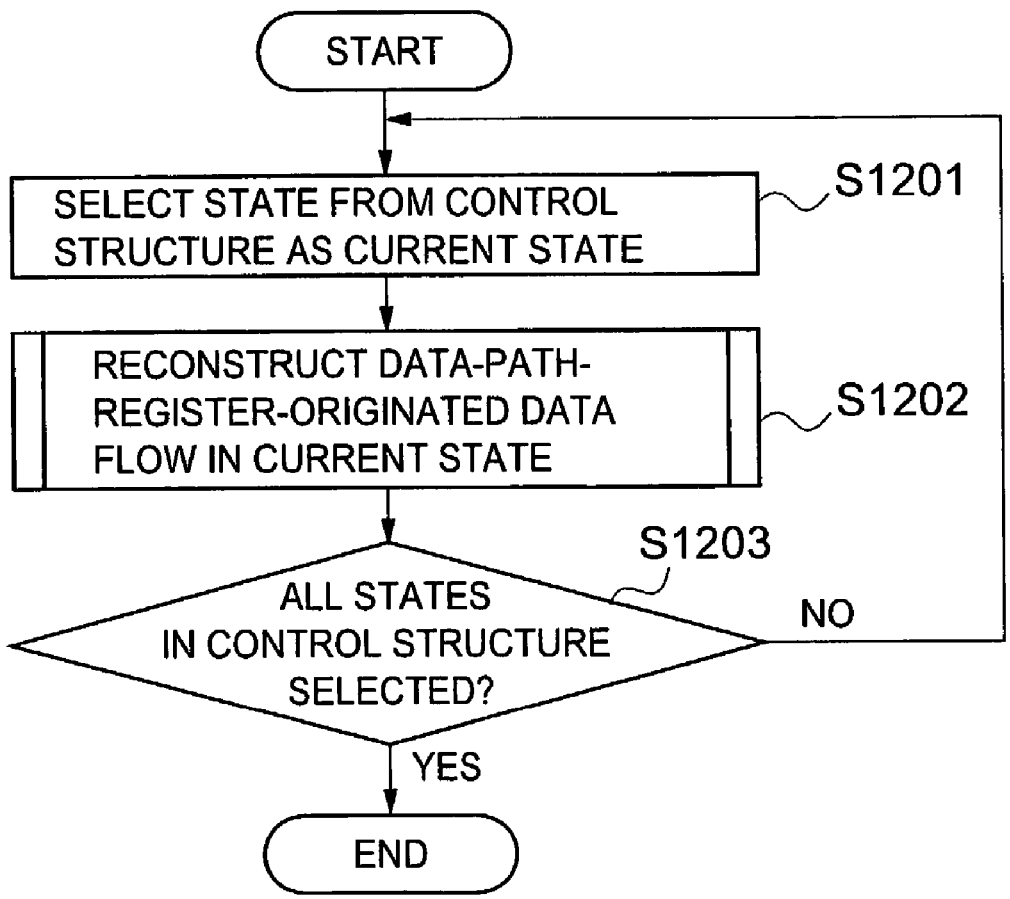
FIG. 12 is an exemplary flowchart showing the entire procedure of a data-flow reconstruction step in the embodiment according to the present invention.
Figure 13:
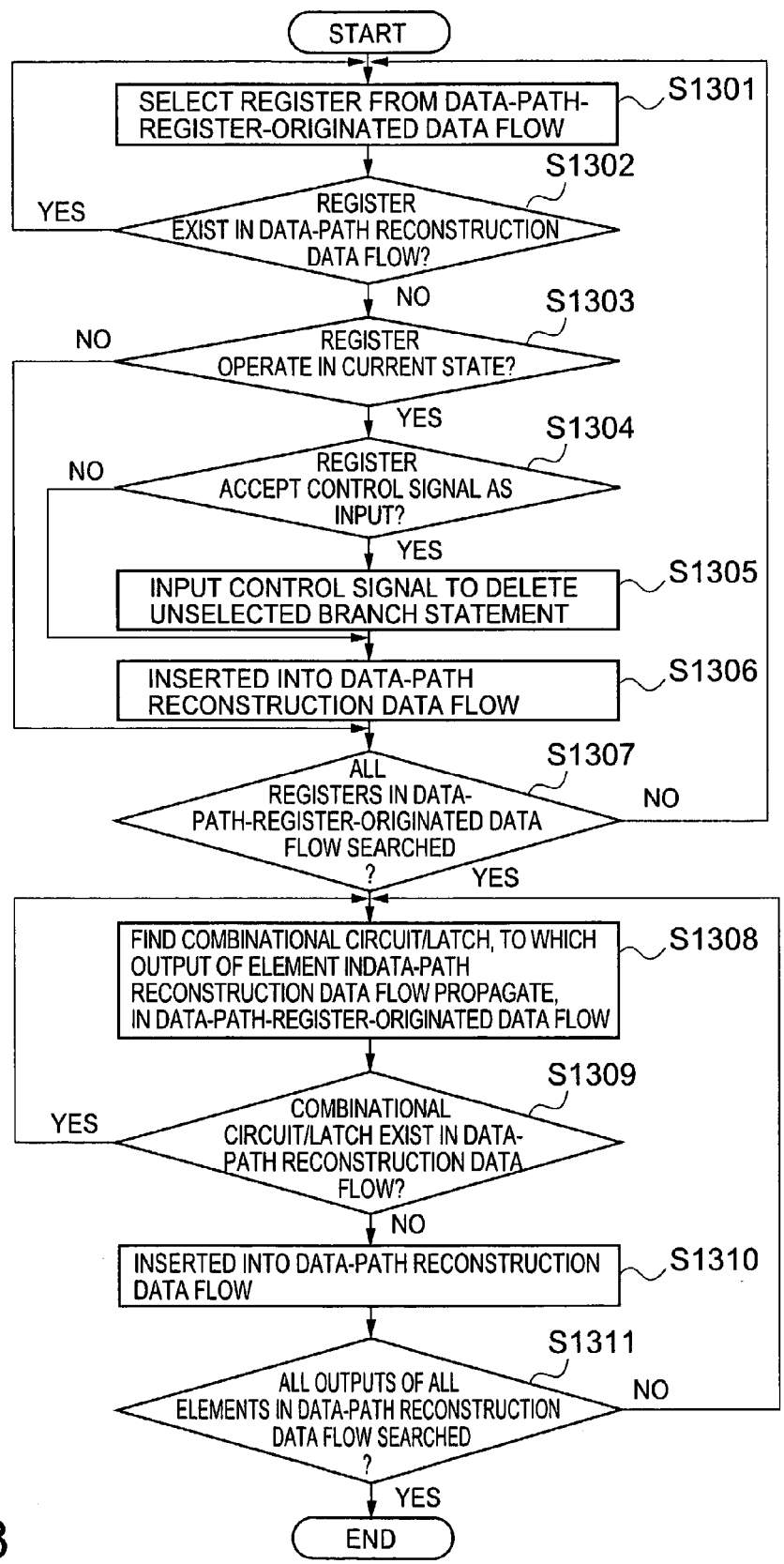
FIG. 13 is an exemplary flowchart showing the data-flow reconstruction step in each state in the embodiment according to the present invention.

The data-flow reconstruction step will be disclosed with reference to FIGS. 12 and 13.

Created in this step is a data flow from the register B1 operating in the data path, in each state of the reconstructed control structure.

In summary, data-flow reconstruction is performed based on the data flows each output by the data-flow creation from the data-path register B1 in the data-flow analysis step (S102).

In detail, as shown in a flow chart in FIG. 12, a specific state is selected from the control structure as a current state (S1201). Reconstructed in the next step is a data flow from a data-path register in this current state (S1202). These two steps are repeated for all states in the control structure (S1203).

The operating register is a register in a data path that will operate under control by an input control signal or a register which will operate in any state.

The data-flow reconstruction step (S1202) will further be disclosed in detail with respect to a flow chart shown in FIG. 13.

A data-path register is found in the data flow created in the data-path-register-originated data-flow creation step (S1301).

When the register does not exist in a data-path data flow to be reconstructed (No in S1302), while it is operable in the current state (YES in S1303), it is determined whether the register accepts a control signal as input (S1304).

When the register accepts the control signal as input, the signal is input to delete unselected if/else statements (S1305). The register is then inserted into a data-path data flow to be reconstructed, a new data flow (S1306).

In contrast, when the register does not accept the control signal as input (NO in S1304), it is inserted into the data-path data flow to be reconstructed, a new data flow (S1306), with no deletion of if/else statements.

Example 1

Insertion of Operating Data-path Register into Data-Path Data Flow to be Reconstructed When a control signal in a certain state is expressed as follows:

(Source Code 9)

e1<=1'b0;

e2<=1'b1;

A register described as follows will not operate and hence not inserted into the data-path data flow to be reconstructed (NO in S1303).

(Source Code 10)

if (e1==1'b1)out1<=in1;

A register described as follows will operate and hence inserted into the data-path data flow to be reconstructed (YES in S1303).

(Source Code 11)

if (e2==1'b1)out2<=in2;

A register described as follows will operate in any state and hence inserted into the data-path data flow to be reconstructed (YES in S1303).

(Source Code 12)

out3<=in3;

When an if/else statement is involved in a register judged as operable in a certain state and the same branch is always selected with control-signal assignment, unselectable branch statements can be deleted from the register (S1305).

Example 2

Deletion of Unselectable Branch Statement From Register

When a control signal in a certain state is expressed as follows:

(Source Code 13)
e1<=1'b1;
e2<=1'b0;

In a register described as follows, an else-if branch statement will not be selected and hence deleted (S1305)

(Source Code 14)
if (e1==1'b1)out1<=in1;
else if (e2==1'b1)out2<=in2;

The register is then written in the following simple form and inserted in the data-path data flow to be reconstructed.

(Source Code 15)
out1<=in1;

On completion of searching of all registers in the data flow from the data-path register B1 (S1307), "combinational circuits/latches" to which the output signal from a register operating in the current state, an element in the data-path data flow to be reconstructed, are selected from the data flow from the data-path register (S1308).

If the selected "combinational circuits/latches" do not exist in the data-path data flow to be reconstructed (NO in S1309), they are inserted into the data flow from the data-path register one by one (S1310).

When all outputs of all elements in the data-path data flow to be reconstructed have been examined (YES in S1311), the step of data-flow reconstruction from the data-path register B1 is completed.

As disclosed, unselected branch statements are deleted from a register (S1305), so that each "combinational circuit/latch" to which a signal will not propagate is not selected, thus a data flow with redundancy being deleted is reconstructed.

Accordingly, data flows constituted by data-path registers and "combinational circuits/latches" are reconstructed by the number of states in the control structure.

Example 3

Exemplary Reconstruction of Data-Path Data Flow

Listed below is a source code 16, an exemplary reconstructed data-path data flow in a state STATE0 of the FSM, the example in the control-structure reconstruction step to the data flow, the example in the data-path-register-originated data-flow creation step.

The control signal in STATE0 is described as follows. The left-side numerals in the reconstructed data flow are line numbers in the RTL description shown in FIG. 22 to 26.

(Source Code 16)
//control signal
34: m1c<=1'b0;
35: m2c<=1'b0;
36: m3c<=1'b0;
37: v3c<=1'b1;
38: v4c<=1'b1;
39: v6c<=1'b0;
40: v5c<=1'b0;
41: a_mux_c<=1'b1;
42: b_mux_c<=1'b1;

The following is the data flow before reconstruction. The left-side numerals in the reconstructed data flow are line numbers in the RTL description shown in FIGS. 22 to 26.

Figure 31:
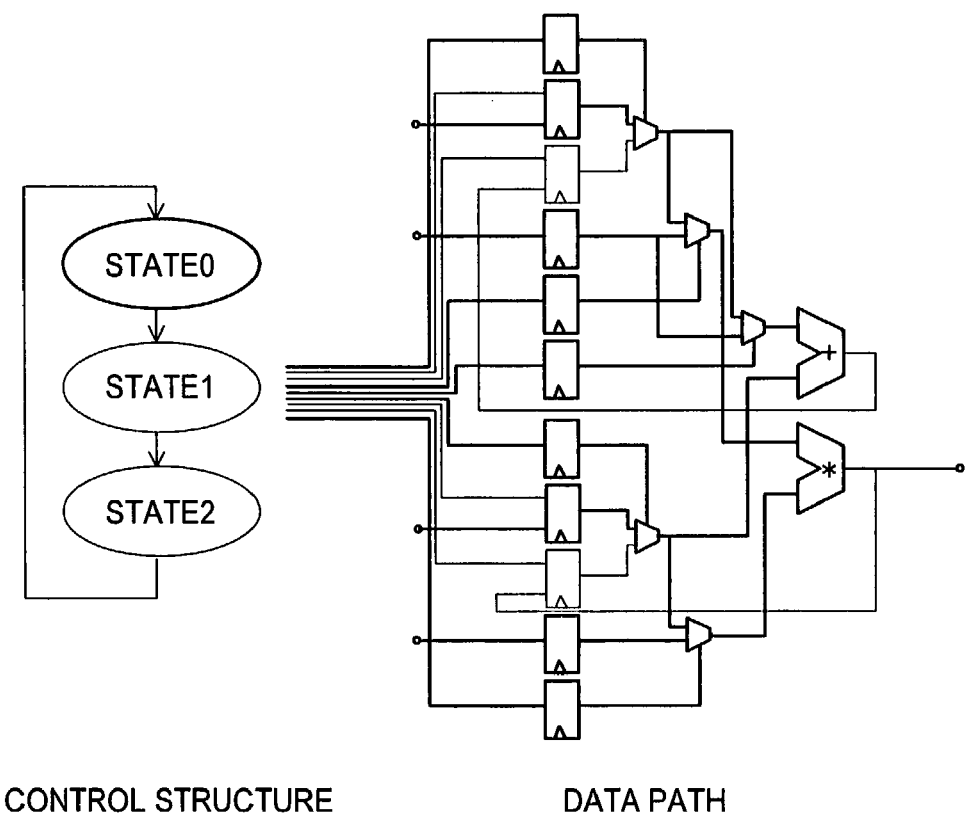
FIG. 31 is a circuit diagram of a data path corresponding to a reconstructed data flow with selection of a register operating under control by a control signal in the embodiment according to the present invention.

(Source Code 17)
//data flow
109: b_mux_c_out<=b_mux_c;
105: a_mux_c_out<=a_mux_c;
101: v2_out<=v2_in;
97: v1_out<=v1_in;
113: if((v3c==1'b1))
114: v3_out<=v3_in;
118: if((v4c==1'b1))
119: v4_out<=v4_in;
93: m3c_out<=m3c;
89: m2c_out<=m2c;
85: m1c_out<=m1c;
128: if((v6c==1'b1))
129: v6_out<=add_out;
123: if((v5c==1'b1))
124: v5_out<=mul_out;
<COMB_BLOCK>
134: b_mux_out=((b_mux_c_out==1'b1)? v3_out: v5_out);
132: a_mux_out=((a_mux_c_out==1'b1)? v4_out: v6_out);
140: mu3_out=((m3c_out==1'b1)? a_mux_out: v2_out);
144: {_add_tmp,add_out}=(mu3_out+b_mux_out);
136: mu1_out=((m1c_out==1'b1)? v1_out:b_mux_out);
138: mu2_out=((m2c_out==1'b1)? v2_out:a_mux_out);
142: {_mu1_tmp,mu1_out}=(mu1_out*mu2_out);

The following is the data flow, the reconstructed data flow with selection of the registers operable under control by the control signal described above. The left-side numerals in the reconstructed data flow are line numbers in the RTL description shown in FIGS. 22 to 26. The corresponding data-path circuitry is shown in FIG. 31.

```
          (Source Code 18)
109 :  b_mux_c_out <=b_mux_c;
105 :  a_mux_c_out <=a_mux_c;
101 :  v2_out <=v2_in;
97 :   v1_out <=v1_in;
114 :  v3_out <=v3_in;
119 :  v4_out <=v4_in;
93 :   m3c_out <=m3c;
89 :   m2c_out <=m2c;
85 :   m1c_out <=m1c;
134 :  b_mux_out =((b_mux_c_out==1'b1)? v3_out : v5_out);
132 :  a_mux_out =((a_mux_c_out==1'b1)? v4_out : v6_out);
140 :  mu3_out =((m3c_out=1'b1)? a_mux_out : v2_out);
144 :  {_add_tmp,add_out} =(mu3_out+b_mux_out);
136 :  mu1_out =((m1c_out==1'b1)? v1_out : b_mux_out);
138 :  mu2_out =((m2c_out==1'b1)? v2_out : a_mux_out);
142 :  {_mul_tmp,mul_out} =(mu1_out*mu2_out);
```

(2-5) Signal Assignment to and Redundant-Statement Deletion from Reconstructed Data-Path Data Flow (S105)

Figure 14:
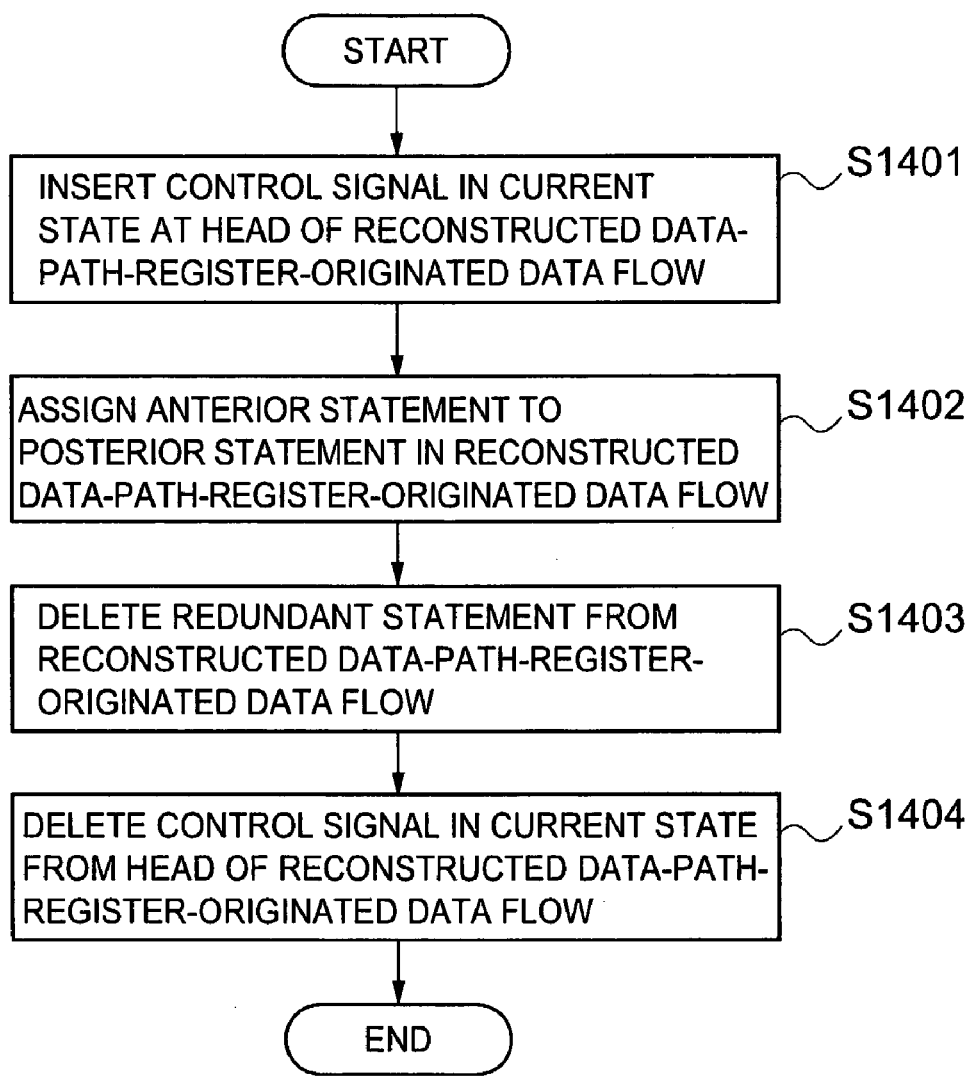
FIG. 14 is an exemplary flowchart showing a signal-assignment step and a redundant-statement deletion step to a reconstructed data-path data flow in the embodiment according to the present invention.

The steps of signal assignment and redundant-statement deletion (S105) will be disclosed with respect to a flow chart shown in FIG. 14.

A control signal in a certain state is inserted (S1401) into the head of the data-path data flow reconstructed in the above data-flow reconstruction step (S104).

In detail, the control-signal insertion is performed when a register operable in the above certain state and a "combinational circuit/latch" allowing signal propagation have been inserted into the reconstructed data-path data flow.

The insertion step is followed by assigning an anterior statement to a posterior statement in the data flow (S1402).

Redundant statements are deleted from the reconstructed data-path data flow (S1403). The control signal in the current state is then deleted from the head of the reconstructed data-path data flow (S1405).

The following are the requirements for the assignment of anterior to posterior statements in the data flow (S1402).

(1) Assignment is inhibited for anterior and posterior statements when both representing registers.

(2) Assignment of an anterior statement to a statement following to a posterior statement is inhibited when a signal identical to the input signal of the anterior statement exists at the output of the posterior statement.

(3) Assignment is inhibited when an anterior statement has the identical signals at its input and output. And, (4) Assignment is inhibited when an "inout" signal is to be assigned to another.

Example 1

Assignment Inhibited

The following example inhibits assignment of a statement 1 to a statement 3 and thereafter following to a statement 2 because the signal existing at the output of the statement 2 is identical to the input signal of the statement 1.

(Source Code 19)
//pre-assignment
b=c; //statement 1
c=a*b; //statement 2
a=a+b; //statement 3

The assignment will give the following, if performed, the result of which is different from the pre-assignment.
//post-assignment
b=c; //statement 1
c=a*c; //statement 2
a=a+c; //statement 3

The step (S105) may be completed at the statement assignment step (S1402). Nevertheless, the succeeding redundant-statement deletion step (S1403) can offer further feasible results.

In detail, when an "if" statement always results in the same branch due to statement assignment in the reconstructed data flow, an unselected branch statement is deleted. Deleted further from the reconstructed data flow is "combinational circuit/latch" to which a signal is propagated only from the deleted statement.

Example 2

Assignment and Deletion of Redundant Statement

Figure 32:
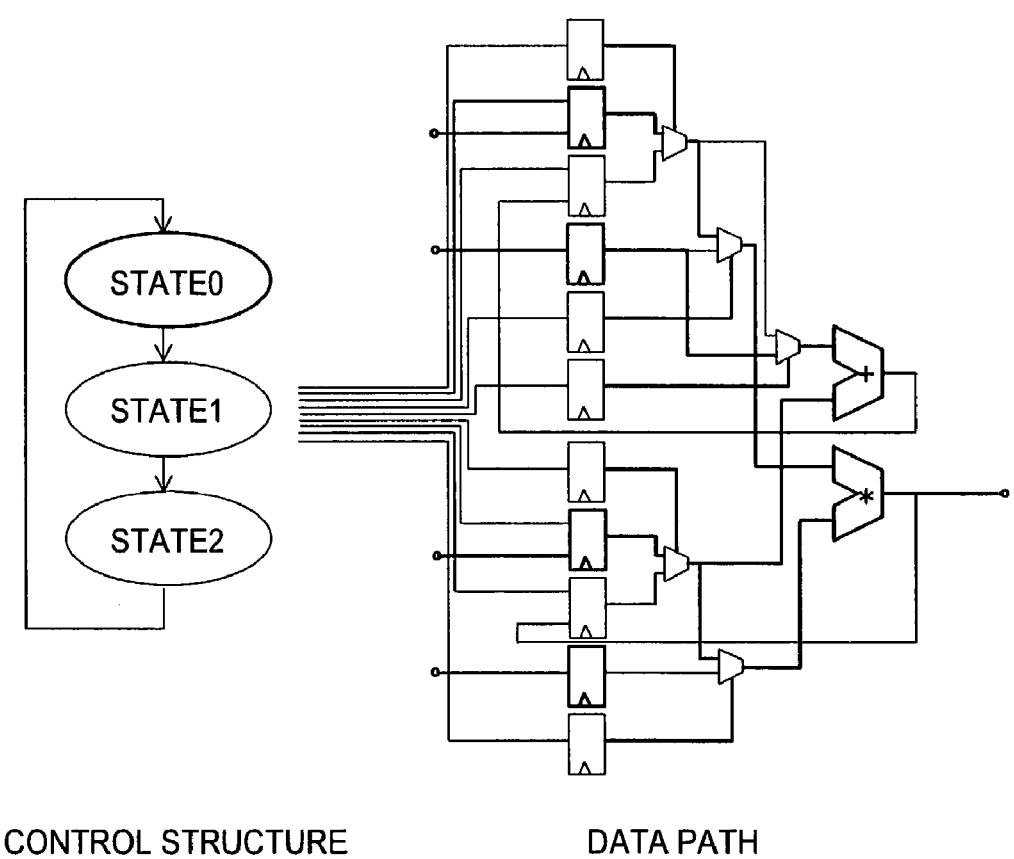
FIG. 32 is a circuit diagram of a data path corresponding to control-signal assignment and redundant-statement deletion in the embodiment according to the present invention.

Listed below is an exemplary source code 21 with unselected branch statements and a control signal being deleted by control-signal insertion and assignment to the head of the reconstructed data flow in the data-path-register-originated data-flow reconstruction step, with FIG. 32, the corresponding circuitry to the data path in hardware. The numerals listed on the left side of the data flow with signal assignment and redundant-statement deletion shown below are line numbers assigned to the RTL description shown in FIG. 22 to 26.

(Source Code 21)
109: b_mux_c_out<=1'b1;
105: a_mux_c_out<=1'b1;
101: v2_out<=v2_in;
97: v1_out<=v1_in;
114: v3_out<=v3_in;
119: v4_out<=v4_in;
93: m3c_out<=1'b0;
89: m2c_out<=1'b0;
85: m1c_out<=1'b0;
134: b_mux_out=v3_in;
132: a_mux_out=v4_in;
140: mu3_out=v2_in;
144: {_add_tmp,add_out}=(v2_in+v3_in);
136: mu1_out=v3_in;
138: mu2_out=v4_in;
142: {_mu1_tmp,mu1_out}=(v3_in*v4_in);

(2-6) Control-Structure/Data-Flow Combination (S106)

Figure 15:
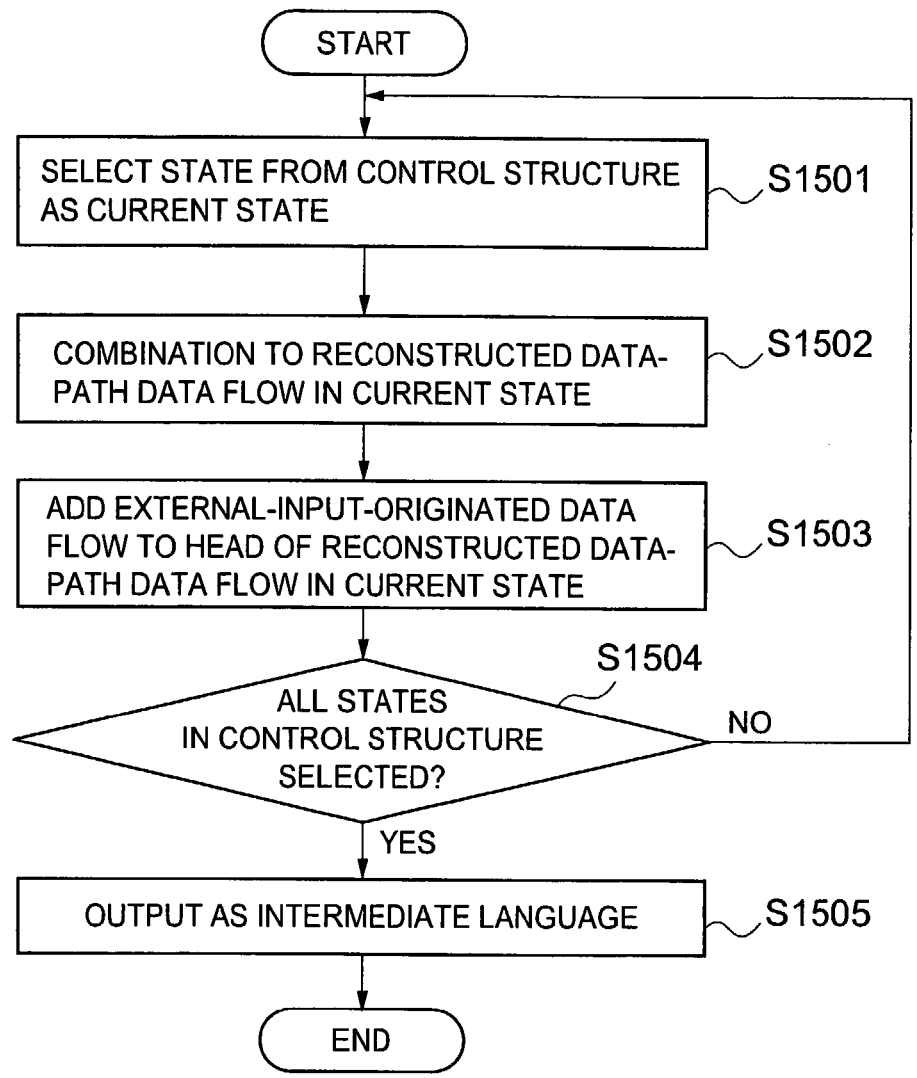
FIG. 15 is an exemplary flowchart showing a control-structure/data-flow combination step in the embodiment according to the present invention.

The control-structure/data-flow combination step will be disclosed with reference to the flow chart shown in FIG. 15.

One state is selected from the control structure, the output from the control-structure reconstruction step. Selected further is a data flow corresponding to the selected state among data flows in each state. The selected data flow is mapped on the corresponding state. Mapping is performed for all states in the control structure.

In detail, as shown in FIG. 15, a specific state is selected as a current state from the control structure (S1501), thus a reconstructed data-path data flow in the current state being combined with the control structure (S1502).

The data flow created in the external-input-signal-originated data-flow creation step is added to the head of the reconstructed and combined data-path data flow in the current state (S1503).

All states in the control structure are selected for control-structure/data-flow combination (YES in S1503).

Reconstructed and combined data-path data flows in all states are output as an intermediate language at the behavior level (S1505).

EXAMPLE

FSM/Data-Path-Data-Flow Combination

Figure 33:
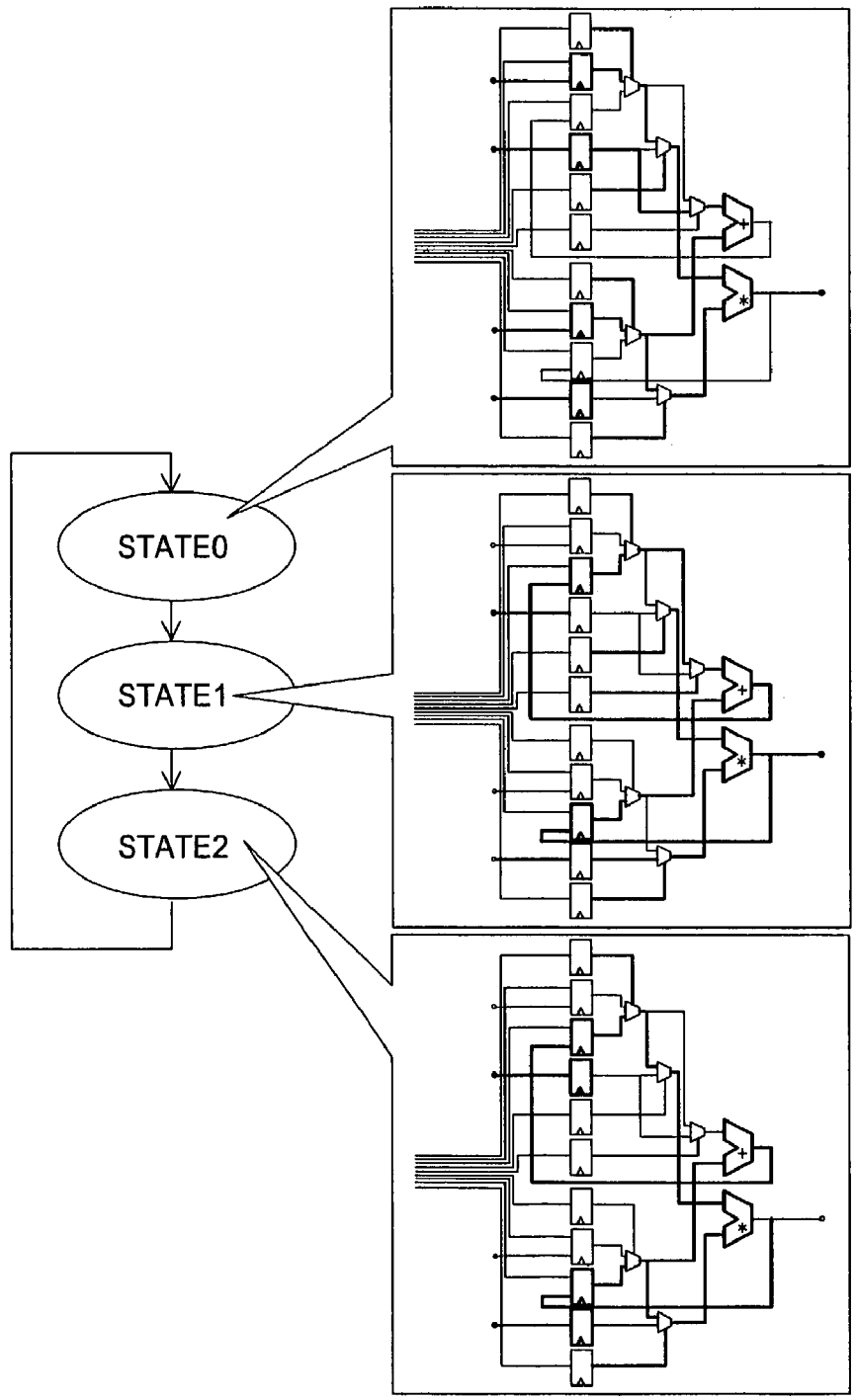
FIG. 33 is a circuit diagram of a data path corresponding to combination of an FSM-originated data flow and a data-path-originated data flow in the embodiment according to the present invention.

Listed below is an exemplary source code 22 for FSM after insertion of a data flow output from the data-path-data-flow reconstruction step into FSM output from the control-structure reconstruction step, with FIG. 33, the data-path circuitry corresponding to each FSM state. The numerals listed on the left side of the data flow shown below are line numbers assigned to the RTL description shown in FIG. 22 to 26. Combination of FMS shown in FIG. 22 and the data-path data flow is output as an intermediate language.

```
        (Source Code 22)
27 :    state <= next_state;
32 :    case(state)
33 :      0:begin
34 :        m1c <=1'b0;
35 :        m2c <=1'b0;
36 :        m3c <=1'b0;
37 :        v3c <=1'b1;
38 :        v4c <=1'b1;
39 :        v6c <=1'b0;
40 :        v5c <=1'b0;
41 :        a_mux_c <=1'b1;
42 :        b_mux_c <=1'b1;
73 :        next_state <= 1;
109 :       b_mux_c_out <=1'b1;
105 :       a_mux_c_out <=1'b1;
101 :       v2_out <=v2_in;
```

-continued

```
97 :        v1_out <=v1_in;
114 :        v3_out <=v3_in;
119 :        v4_out <=v4_in;
93 :        m3c_out <=1'b0;
89 :        m2c_out <=1'b0;
85 :        m1c_out <=1'b0;
134 :        b_mux_out =v3_in;
132 :        a_mux_out =v4_in;
140 :        mu3_out =v2_in;
144 :        {_add_tmp,add_out} =(v2_in+v3_in);
136 :        mu1_out =v3_in;
138 :        mu2_out =v4_in;
142 :        {_mul_tmp,mul_out} =(v3_in*v4_in);
43 :     end
44 :     1:begin
45 :        m1c <=1'b1;
46 :        m2c <=1'b1;
47 :        m3c <=1'b1;
48 :        v3c <=1'b0;
49 :        v4c <=1'b0;
50 :        v6c <=1'b1;
51 :        v5c <=1'b1;
52 :        a_mux_c <=1'b0;
53 :        b_mux_c <=1'b0;
76 :        next_state <= 2;
109 :        b_mux_c_out <=1'b0;
105 :        a_mux_c_out <=1'b0;
101 :        v2_out <=v2_in;
97 :        v1_out <=v1_in;
93 :        m3c_out <=1'b1;
89 :        m2c_out <=1'b1;
85 :        m1c_out <=1'b1;
129 :        v6_out <=add_out;
124 :        v5_out <=mul_out;
134 :        b_mux_out =mul_out;
132 :        a_mux_out =add_out;
140 :        mu3_out =add_out;
144 :        {_add_tmp,add_out} =(add_out+mul_out);
136 :        mu1_out =v1_in;
138 :        mu2_out =v2_in;
142 :        {_mul_tmp,mul_out} =(v1_in*v2_in);
54 :     end
55 :     2:begin
56 :        m1c <=1'b0;
57 :        m2c <=1'b0;
58 :        m3c <=1'b0;
59 :        v3c <=1'b0;
60 :        v4c <=1'b0;
61 :        v6c <=1'b1;
62 :        v5c <=1'b1;
63 :        a_mux_c <=1'b0;
64 :        b_mux_c <=1'b0;
79 :        next_state <= 0;
109 :        b_mux_c_out <=1'b0;
105 :        a_mux_c_out <=1'b0;
101 :        v2_out <=v2_in;
97 :        v1_out <=v1_in;
93 :        m3c_out <=1'b0;
89 :        m2c_out <=1'b0;
85 :        m1c_out <=1'b0;
129 :        v6_out <=add_out;
124 :        v5_out <=mul_out;
134 :        b_mux_out =mul_out;
132 :        a_mux_out =add_out;
140 :        mu3_out =v2_in;
144 :        {_add_tmp,add_out} =(v2_in+mul_out);
136 :        mu1_out =mul_out;
138 :        mu2_out =v6_out;
142 :        {_mul_tmp,mul_out} =(mul_out*v6_out);
65 :     end
66 :   endcase
```

(2-7) Deletion of Redundant Statement from Intermediate language (S107)

Figure 16:
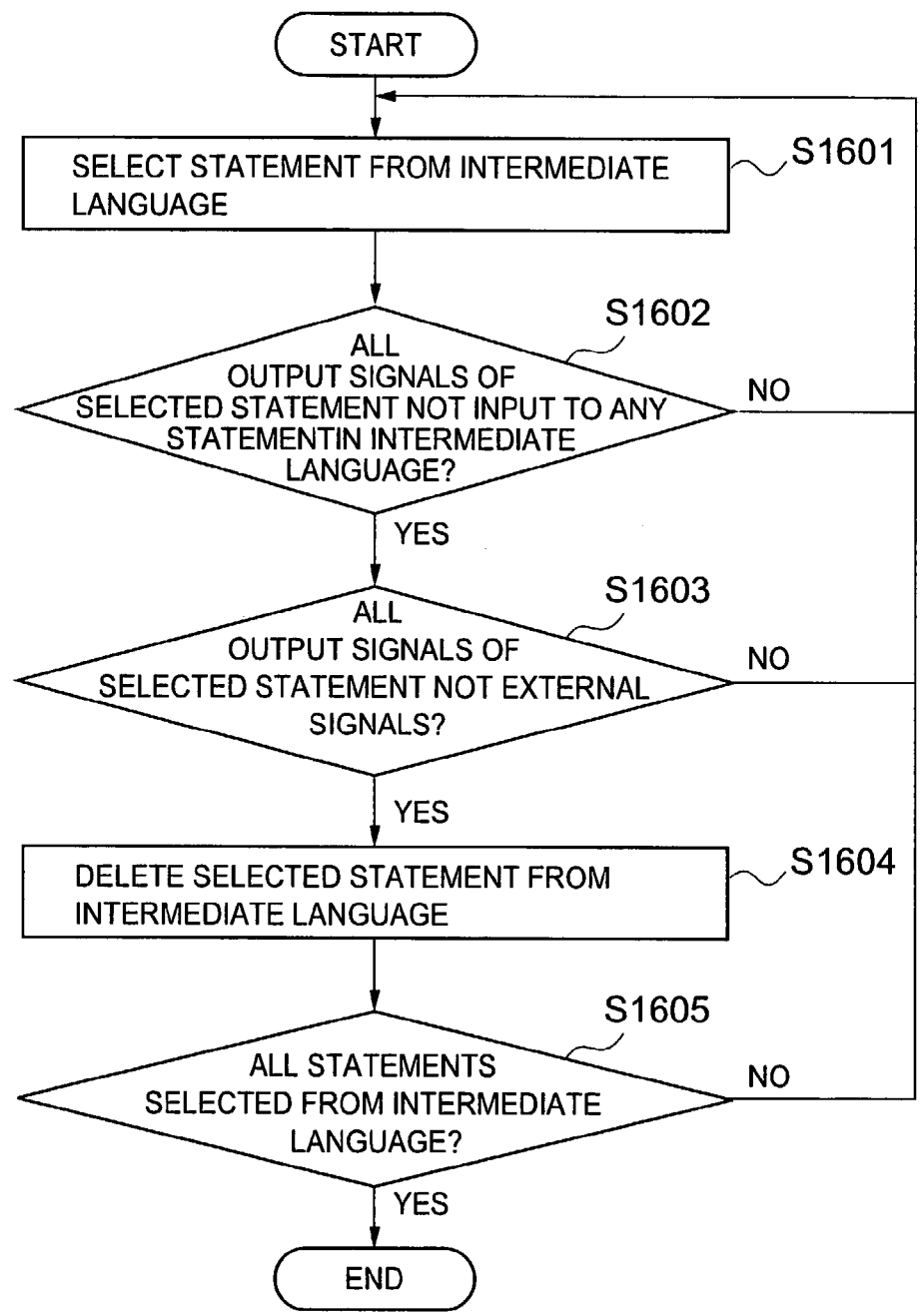
FIG. 16 is an exemplary flowchart showing a intermediate-language redundant-statement deletion step in the embodiment according to the present invention.
Figure 17:
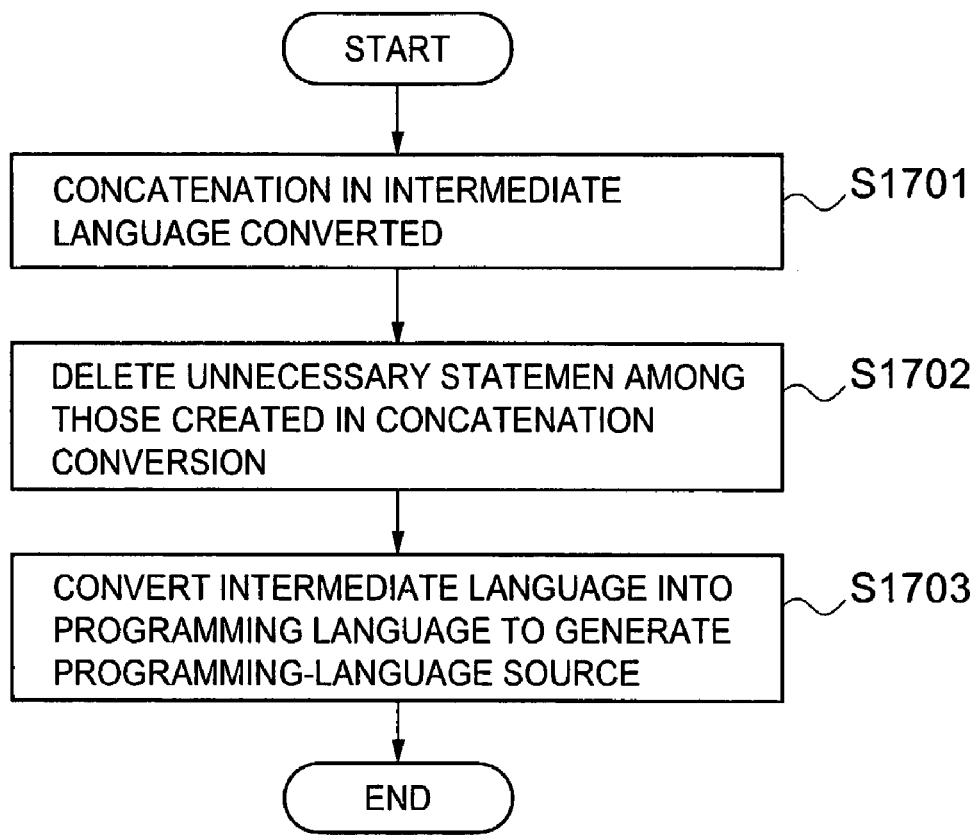
FIG. 17 is an exemplary flowchart showing a conversion step to a program language executable on computer.

The step of deleting redundant statements from an intermediate language will be disclosed with reference to the flow chart shown in FIG. 16.

The intermediate language given by the control-structure/data-flow combination step has less types of input signal for statements in the data flow, due to the former step with control-signal insertion and/or assignment between statements in data flow.

Some statements necessary before assignment may be unnecessary anymore in the intermediate language. These unnecessary or redundant statements are deleted in this step (S107).

In an exemplary flow chart shown in FIG. 16, a specific statement is selected from the intermediate language (S1601).

It is determined whether all output signals of the selected statement are inputs to any statement in the intermediate language.

If they are inputs (NO in S1602), the process returns to step S1601 to select the next statement. On the contrary, if they are not inputs (YES in S1602), it is determined whether all output signals of the selected statement are not external signals.

If they are external signals (NO in S1603), the process returns to step S1601 to select the next statement.

On the contrary, if they are not external signals (YES in S1603), the selected statement is deleted from the intermediate language (S1604).

These steps are repeated for all statements to select them from the intermediate language (YES in S1605), and the step (S107) is completed.

A redundant statement in this step (S107) has no corresponding statements to which each output signal of the redundant statement is not input. One requirement is that deletion be inhibited if each output signal is an external signal.

The following is an exemplary deletion of redundant statements from the intermediate language under the requirement.

EXAMPLE

Deletion of Redundant Statement From Intermediate Language

Statements, whose output signals are not external signals and not input to any other statements, are deleted from the intermediate language listed below as a source code 23, output from the control-structure/data-flow combination step.

The numerals listed on the left side of the intermediate language below are line numbers assigned to the RTL description shown in FIG. 22 to 26.

```
        (Source Code 23)
27 :   state <= next_state;
32 :   case(state)
33 :     0:begin
34 :        m1c <=1'b0;
35 :        m2c <=1'b0;
36 :        m3c <=1'b0;
37 :        v3c <=1'b1;
38 :        v4c <=1'b1;
39 :        v6c <=1'b0;
40 :        v5c <=1'b0;
41 :        a_mux_c <=1'b1;
42 :        b_mux_c <=1'b1;
73 :        next_state <= 1;
109 :        b_mux_c_out <=1'b1;
105 :        a_mux_c_out <=1'b1;
101 :        v2_out <=v2_in;
97 :        v1_out <=v1_in;
114 :        v3_out <=v3_in;
```

-continued

```
119 :        v4_out <=v4_in;
 93 :        m3c_out <=1'b0;
 89 :        m2c_out <=1'b0;
 85 :        m1c_out <=1'b0;
134 :        b_mux_out =v3_in;
132 :        a_mux_out =v4_in;
140 :        mu3_out =v2_in;
144 :        {_add_tmp,add_out} =(v2_in+v3_in);
136 :        mu1_out =v3_in;
138 :        mu2_out =v4_in;
142 :        {_mul_tmp,mul_out} =(v3_in*v4_in);
 43 :     end
 44 :     1:begin
 45 :        m1c <=1'b1;
 46 :        m2c <=1'b1;
 47 :        m3c <=1'b1;
 48 :        v3c <=1'b0;
 49 :        v4c <=1'b0;
 50 :        v6c <=1'b1;
 51 :        v5c <=1'b1;
 52 :        a_mux_c <=1'b0;
 53 :        b_mux_c <=1'b0;
 76 :        next_state <= 2;
109 :        b_mux_c_out <=1'b0;
105 :        a_mux_c_out <=1'b0;
101 :        v2_out <=v2_in;
 97 :        v1_out <=v1_in;
 93 :        m3c_out <=1'b1;
 89 :        m2c_out <=1'b1;
 85 :        m1c_out <=1'b1;
129 :        v6_out <=add_out;
124 :        v5_out <=mul_out;
134 :        b_mux_out =mul_out;
132 :        a_mux_out =add_out;
140 :        mu3_out =add_out;
144 :        {_add_tmp,add_out} =(add_out+mul_out);
136 :        mu1_out =v1_in;
138 :        mu2_out =v2_in;
142 :        {_mul_tmp,mul_out} =(v1_in*v2_in);
 54 :     end
 55 :     2:begin
 56 :        m1c <=1'b0;
 57 :        m2c <=1'b0;
 58 :        m3c <=1'b0;
 59 :        v3c <=1'b0;
 60 :        v4c <=1'b0;
 61 :        v6c <=1'b1;
 62 :        v5c <=1'b1;
 63 :        a_mux_c <=1'b0;
 64 :        b_mux_c <=1'b0;
 79 :        next_state <= 0;
109 :        b_mux_c_out <=1'b0;
105 :        a_mux_c_out <=1'b0;
101 :        v2_out <=v2_in;
 97 :        v1_out <=v1_in;
 93 :        m3c_out <=1'b0;
 89 :        m2c_out <=1'b0;
 85 :        m1c_out <=1'b0;
129 :        v6_out <=add_out;
124 :        v5_out <=mu1_out;
134 :        b_mux_out =mul_out;
132 :        a_mux_out =add_out;
140 :        mu3_out =v2_in;
144 :        {_add_tmp,add_out} =(v2_in+mul_out);
136 :        mul_out =mul_out;
138 :        mu2_out =v6_out;
142 :        {_mul_tmp,mul_out} =(mul_out*v6_out);
 65 :     end
 66 :  endcase
```

Figure 34:
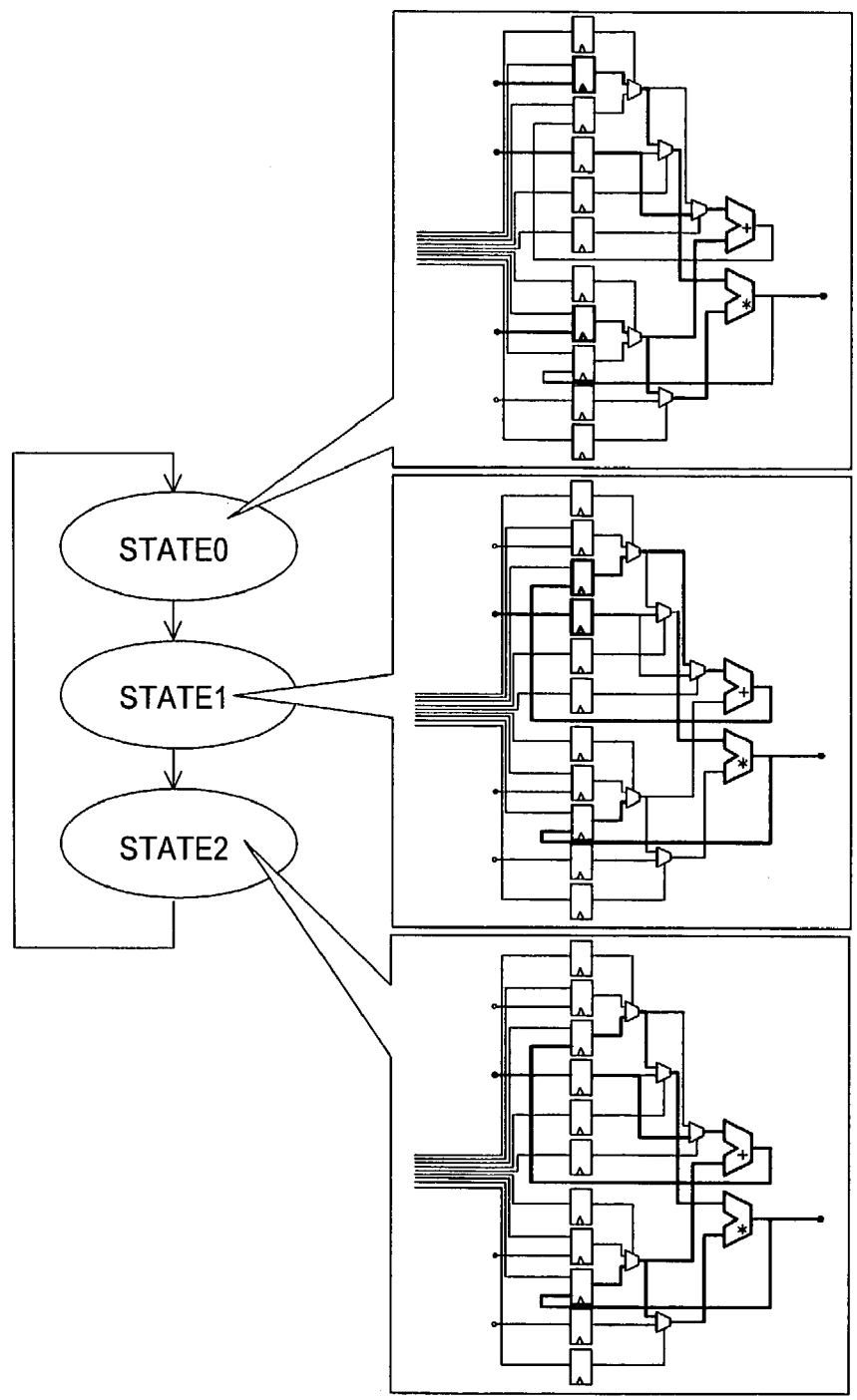
FIG. 34 is a circuit diagram of a data path corresponding to intermediate-language redundant-statement deletion in the embodiment according to the present invention.

The program listed below in a source code 24 is a reconstructed version with deletion of redundant statements from the intermediate language disclosed above, with FIG. 34 showing data-path circuitry corresponding to each FSM state. Reconstructed FSMs are output as a behavior-level intermediate language.

The numerals listed on the left side of the intermediate language below are line numbers assigned to the RTL description shown in FIG. 22 to 26.

```
         (Source Code 24)
 27 :    state <= next_state;
 32 :    case(state)
 33 :       0:begin
 73 :          next_state <= 1;
144 :          {_add_tmp,add_out} =(v2_in+v3_in);
142 :          {_mul_tmp,mul_out} =(v3_in*v4_in);
 42 :       end
 44 :       1:begin
 76 :          next_state <= 2;
 66 :          v6_out <=add_out;
144 :          {_add_tmp,add_out} =(add_out+mul_out);
142 :          {_mul_tmp,mul_out} =(v1_in*v2_in);
 54 :       end
 55 :       2:begin
 79 :          next_state <= 0;
129 :          v6_out <=add_out;
144 :          {_add_tmp,add_out} =(v2_in+mul_out);
142 :          {_mul_tmp,mul_out} =(mul_out*v6_out);
 65 :       end
 66 :    endcase
```

(3) Conversion of Behavior-Level Intermediate Language to Programming Language Executable on Computer (S108)

The step (S108) creates object codes from the intermediate language created in the steps of structure-element analysis (S101) to control-structure/data-flow combination (S106) or to redundant-statement deletion (S107).

In detail, the step (S108) converts the behavior-level intermediate language created in the step of control-structure/data-flow combination (S106) or redundant-statement deletion (S107) to a programming language executable on computer.

The step (S108) will be disclosed for Language C as a programming language executable on computer.

The created intermediate language will not contradict the HDL data flow, if executed sequentially from the top statement. Therefore, conversion of the intermediate language into Language C by one-to-one correspondence can create a target Language C.

Shown in FIGS. 35 and 36 are exemplary conversion rules. FIG. 35 shows conversion rules for signal and constant. FIG. 36 shows other conversion rules. Numerals in the intermediate language in this embodiment are expressed with binary digits.

Language C does not have a concatenation-operation function. This embodiment thus requires a new statement equivalent to concatenation. The new statement will, however, be deleted when no statements exist in FSM, which accept its all output signals, under the requirement that deletion be inhibited when the output signals external signal.

Example 1

Conversion of Concatenation to Language C

Concatenation statements shown below require that 255 be ANDed with each bit for supplying eight lower-significant bits of a signal "c" to a signal "b". It is also required that the signal "c" be shifted in right by 8 bits and 255 be ANDed with each bit for supplying eight upper-significant bits of the signal "c" to a signal "a".

(Source Code 25)
wire [7:0]a, b;
wire [15:0]c;
{a, b}=c;

The results are equivalent conversion as shown below:
(Source Code 26)
```
unsigned long a, b, c;
b=c & 255U;
a=(c>>8) & 255U;
```

Example 2

Conversion to Language C

Listed below is exemplary Language C converted from the intermediate language created in the control-structure/data-flow combination step, with the one-to-one conversion and concatenation discussed above.

```
        (Source Code 27)
state = next_state;
switch (state) {
    case 0:
        next_state = 1;
        add_out = (v2_in+v3_in) & 255UL;
        _add_tmp = ((v2_in+v3_in) >> 8) & 1UL;
        mul_out = (v3_in*v4_in) & 255UL;
        _mul_tmp = ((v3_in*v4_in) >> 8) & 255UL;
        break;
    case 1:
        next_state = 2;
        v6_out = add_out;
        _add_tmp = ((add_out+mul_out) >> 8) & 1UL;
        add_out = (add_out+mul_out) & 255UL;
        mul_out = (v1_in*v2_in) & 255UL;
        _mul_tmp = ((v1_in*v2_in) >> 8) & 255UL;
        break;
    case 2:
        next_state = 0;
        v6_out = add_out;
        add_out = (v2_in+mul_out) & 255UL;
        _add_tmp = ((v2_in+mul_out) >> 8) & 1UL;
        mul_out = (mul_out*v6_out) & 255UL;
        _mul_tmp = ((mul_out*v6_out) >> 8) & 255UL;
        break;
}
```

The resultant source of Language C is listed below, with deletion of redundant statements among new ones created by concatenation.

```
        (Source Code 28)
state = next_state;
switch (state) {
    case 0:
        next_state = 1;
        add_out = (v2_in+v3_in) & 255UL;
        mul_out = (v3_in*v4_in) & 255UL;
        break;
    case 1:
        next_state = 2;
        v6_out = add_out;
        add_out = (add_out+mul_out) & 255UL;
        mul_out = (v1_in*v2_in) & 255UL;
        break;
    case 2:
        next_state = 0;
        v6_out = add_out;
        add_out = (v2_in+mul_out) & 255UL;
        mul_out = (mul_out*v6_out) & 255UL;
        break;
}
```

(4) Simulation

The program executable on computer converted from the RTL-Verilog-HDL source in this embodiment can be simulated. It is required for functional allocation of functions needed in MPU/LSI-equipped systems to hardware and software, for optimization of parameters, such as, system performance, costs for production and developments, and power consumption.

The functional allocation for parameter optimization in the early stage of system developments is called design in hardware/software co-design. Simulation in hardware/software co-design is repeated for optimum functional allocation.

High-speed verification is available to the hardware described at the behavior level. Therefore, conversion according to the present invention to RTL-HDL to create a behavior-level program language executable on computer offers high-speed simulation in hardware/software co-design.

A programming-language source converted from RTL-HDL according to the present invention allows high-speed simulation in software verification in the latter stage of LSI designs.

Figure 18:
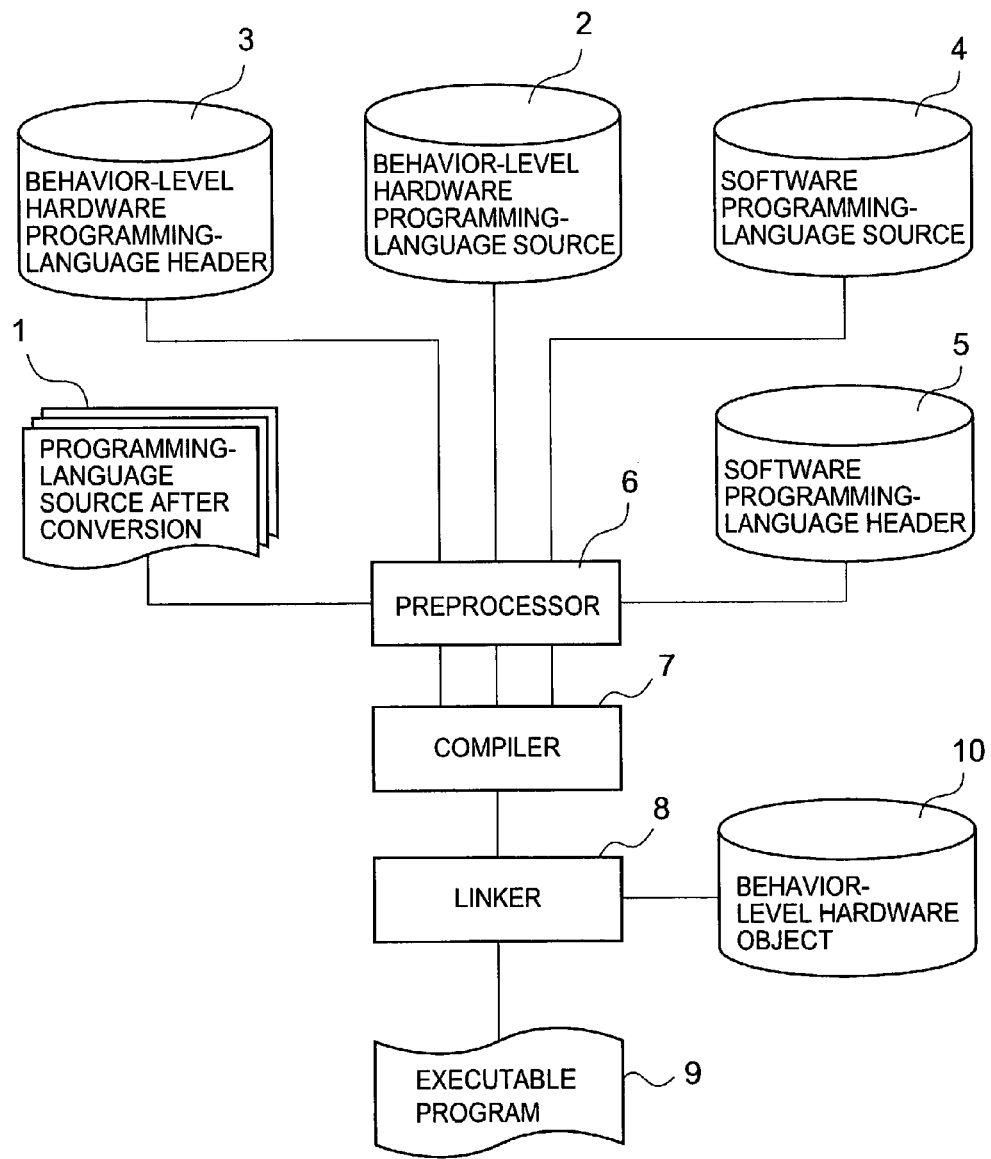
FIG. 18 is an exemplary flowchart showing a simulation-execution step in the embodiment according to the present invention.

Illustrated in FIG. 18 is an exemplary simulation.

A programming language 1 converted according to the embodiment is sent to a preprocessor 6, a compiler 7 and a linker 8, together with a behavior-level hardware programming-language source 2, a hardware programming-language header 3, a software programming-language source 4, and a software programming-language header 5, for preprocessing, compiling and linking, respectively. A complied program at the compiler 7 may be linked with a behavior-level hardware object 10 at the linker 8.

The programming language 1 is converted into a computer-executable program 9 through these procedures, for simulation.

(5) Advantage of Embodiment

Advantages of the embodiment are discussed with reference to FIG. 37, with comparison of a computer-executable programming language obtained through the embodiment to a programming language obtained through a known technique.

Indicated in FIG. 37 are line numbers of effective codes in C/C++ and step numbers of assembler codes complied into output source codes by a GNU C++ compiler, for C++ language source codes output by Verilog2C++ and a computer-executable programming language, or Language C, according to the present invention, both converted from 146 lines of Verilog-HDL source.

FIG. 37 teaches that the embodiment is superior to the known technique in line numbers of effective codes for output source codes and step numbers of assembler codes. It is understandable from FIG. 37 that the embodiment offers source codes of less computation times.

As disclosed in detail, the present invention analyzes a control signal from a controller and an equivalent circuitry to a data path decided according to the control signal in RTL description constituted by the controller and the data path.

This analysis offers a programming language with the minimum number of computations but equivalent to an original operation description, while maintaining the original input/output relationship.

Particularly, the present invention offers final products with no redundant computations in conversion of RTL description to hardware operations and computer languages, thus achieving extremely high running speed for converted computer languages, and hence achieving high-speed simulation.

It is further understood by those skilled in the art that the foregoing description is an embodiment of the disclosed device and that various change and modification maybe made in the invention without departing from the spirit and scope thereof.

What is claimed is:

1. A method of converting RTL description to a computer-executable program language by a computer, the RTL description describing hardware, the hardware including a controller and a data path, the controller having a state register and a first combinational circuitry, the data path having a data-path register controlled by a control signal from the controller and a second combinational circuitry, the computer functioning as an element analyzer, a data-flow analyzer, a control-structure reconstructer, a data-flow reconstructer, a control-structure/data-flow combiner and an object-code generator, the method comprising:

analyzing elements of the RTL description, at the element analyzer;

creating a first data flow from the state register and a second data flow from the register in the data path, at the data-flow analyzer;

reconstructing a control structure in which the controller controls the data path based on the first data flow, at the control-structure reconstructer;

reconstructing the second data flow to create a data flow from the data-path register operating in each state of the control structure, at the data-flow reconstructer;

mapping each reconstructed data flow in each state of the control structure, thus outputting a behavior-level intermediate language, at the control-structure/data-flow combiner; and converting the behavior-level intermediate language into a programming language executable on computer, at the object-code generator.

2. The conversion method according to claim 1, wherein the analyzing of elements includes:

analyzing lexicon and syntax to the RTL description to extract elements of the RTL description;

constructing a data structure corresponding to the extracted elements of the RTL description;

analyzing semantic to the data structure for creating meaning of signals to be used in the hardware;

converting a hierarchical structure of the RTL description to a flat structure by hierarchical developments; and carrying out constant propagation by scanning the flat structure.

3. The conversion method according to claim 2, wherein the constructing of the data-structure in the analyzing of the elements performs labeling to a state register operating in synchronism with a synchronization signal in the controller.

4. The conversion method according to claim 3, wherein the creating of the first and second data flows includes:

finding the state register based on the labeling;

inserting the found state register into a third data flow to be created as the first data flow from the state register;

finding all first combinational circuitries to which an output signal of the inserted state register is to propagate;

inserting the first combinational circuitries into the third data flow only if the first combinational circuitries do not exist in the third data flow; and rearranging the first combinational circuitries in the third data flow, in creation of the first data flow.

5. The conversion method according to claim 1, wherein the computer further functions as a redundant-statement deleter and the method further comprises deleting a redundant statement from the data flow created from data-path registers.

6. The conversion method according to claim 5, wherein the deleting of the redundant-statement includes:

after a register operating in a certain state and a second combinational circuitry to which a signal is to propagate being inserted into a data-path reconstruction data flow, inserting a control signal in the certain state into a head of the data-path reconstruction data flow;

assigning an anterior statement to a posterior statement in the data-path reconstruction data flow;

deleting a redundant statement from the data-path reconstruction data flow; and deleting the control signal from the head of the data-path reconstruction data flow.

7. The conversion method according to claim 1, wherein the computer further functions as a redundant-statement deleter and the method further comprises deleting a redundant statement from the intermediate language.

8. The conversion method according to claim 7, wherein the deleting of the redundant-statement includes:

a first step of selecting a certain statement from the intermediate language;

a second step of determining whether or not all outputs from the selected statement are input to any statement in the intermediate language;

a third step of, when all outputs are input to the statement, selecting a next statement to perform the second step, whereas, when all outputs are not input to the statement, determining whether or not all outputs from the selected statement are external signals; and a fourth step of, when all outputs are external signals, returning to the second step, whereas, when all outputs are not external signals, deleting the selected statement from the intermediate language.

9. The conversion method according to claim 1, wherein the creating of the first and second data flows includes:

finding the state register;

inserting the found state register into a third data flow to be created as the first data flow from the state register;

finding all first combinational circuitries to which an output signal of the inserted state register is to propagate;

inserting the first combinational circuitries into the third data flow only if the first combinational circuitries do not exist in the third data flow; and rearranging the first combinational circuitries in the third data flow, in creation of the first data flow.

10. The conversion method according to claim 1, wherein the creating of the first and second data flows includes:

finding all data-path registers operating in synchronism with a synchronization signal in the data path;

inserting the found data-path registers into a third data flow to be created as the second data flow from the data-path register only if the data-path registers do not exist in the third data flow;

rearranging the data-path registers in the third data flow so that an output from a data-path register as an anterior element in the third data flow is not an input to another data-path register as a posterior element in the third data flow;

finding all second combinational circuitries to which output signals of the data-path registers are to propagate;

inserting the second combinational circuitries into the third data flow only if the second combinational circuitries do not exist in the third data flow; and rearranging the second combinational circuitries in the third data flow, in creation of the second data flow.

11. The conversion method according to claim 1, wherein the creating of the first and second data flows further comprises creating a third data flow from an external input signal.

12. The conversion method according to claim 11, wherein the creating of the first and second data flows includes:
   finding all third combinational circuitries for each of which a first source code has an external input signal and constant at a right side of the first source code;
   inserting the third combinational circuitries into a fourth data flow to be created as the third data flow from the external input signal only if the third combinational circuitries do not exist in the fourth data flow;
   finding all fourth combinational circuitries for each of which a second source code has an output signal from a corresponding inserted third combinational circuitry and constant at the right side of the second source code;
   inserting the fourth combinational circuitries into the fourth data flow only if the fourth combinational circuitries do not exist in the fourth data flow; and
   rearranging the third and fourth combinational circuitries so that an output from a combinational circuitry as an anterior element in the fourth data flow is not an input to another combinational circuitry as a posterior element in the third data flow, in creation of the third data flow.

13. The conversion method according to claim 1, wherein the reconstructing of the control-structure includes:
   selecting a state register from the first data flow from the state register and inserting the selected state register into a control-structure reconstruction data flow;
   repeating a first step, a second step and a third step until a state machine is found, wherein
   the first step selects a first combinational circuitry to which an output signal of the inserted state register is to propagate only if the inserted state register is not the state machine,
   the second step inserts the selected first combinational circuitry into the control-structure reconstruction data flow, and
   the third step determines whether the inserted first combinational circuitry is the state machine; and
   copying a train of elements among elements of the first data flow but not involved in the control-structure reconstruction data flow into, after each branch statement of the state machine in the control-structure, reconstruction data flow, thus reconstructing the control-structure reconstruction data flow to create the control structure.

14. The conversion method according to claim 1, wherein the reconstructing of the second data flow includes:
   selecting a state from the control structure based on the second flow from the data-path register;
   reconstructing a data flow from a data-path register in the selected state, thus constructing data-path reconstruction data flow; and
   repeating the state selecting step and the data-path reconstruction data-flow construction step until all states are found in the control structure.

15. The conversion method according to claim 14, wherein the reconstructing of the second data-flow includes:
   finding the data-path register based on the second data flow from the data-path register;
   determining whether or not the data-path register accepts an input signal when the data-path register does not exist in the data-path reconstruction data flow but operating in the selected state;
   when the data-path register accepts the input signal, inputting the control signal to the data-path register to delete an unselected branch statement, thus inserting the data-path register into the data-path reconstruction data-flow;
   when the data-path register does not accept the input signal, inserting the data-path register into the data-path reconstruction data flow with no redundant-statement deletion;
   selecting second combinational circuitries, to which an output signal of the data-path register operating in the selected state and being an element of the data-path reconstruction data flow is to propagate, from the second data flow, after repeating the finding, determining and inserting steps to all data-path registers in the second data flow; and
   inserting the selected second combinational circuitries into the data-path reconstruction data flow one by one when the selected second combinational circuitries do not exist in the data-path reconstruction data flow.

16. A computer program executable on computer for hardware-operation description conversion of RTL description describing hardware, the hardware including a controller and a data path, the controller having a state register and a first combinational circuitry, and the data path having a data-path register controlled by a control signal from the controller and a second combinational circuitry, the conversion comprising:
   analyzing elements in the RTL description;
   creating a first data flow from the state register and a second data flow from the data-path register;
   reconstructing a control structure in which the controller controls the data path through reconstruction of the created first data flow;
   reconstructing the second data flow to create a data flow from data-path registers operating in corresponding states of the control structure;
   mapping each reconstructed data flow in each state of the control structure, thus outputting a behavior-level intermediate language; and
   converting the behavior-level intermediate language into a programming language executable on the computer.

17. The computer program according to claim 16, the conversion further including deleting redundant statements from the data flow created from the data-path registers.

18. The computer program according to claim 16, the conversion further including deleting redundant statements from the intermediate language.

* * * * *